(12) United States Patent
Jow et al.

(10) Patent No.: US 9,082,943 B2
(45) Date of Patent: Jul. 14, 2015

(54) OPTOELECTRONIC PACKAGE AND METHOD OF MANUFACTURING THE SAME

(71) Applicant: APTOS TECHNOLOGY INC., Hsin-Chu (TW)

(72) Inventors: En-Min Jow, Hsin-Chu (TW); Chi-Jang Lo, Hsin-Chu (TW); Nan-Chun Lin, Hsin-Chu (TW); Shang Yu Chang Chien, Hsin-Chu (TW)

(73) Assignee: APTOS TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 14/141,868

(22) Filed: Dec. 27, 2013

(65) Prior Publication Data
US 2014/0183591 A1 Jul. 3, 2014

(30) Foreign Application Priority Data

Dec. 28, 2012 (TW) ............................. 101151227 A
Feb. 4, 2013 (TW) ............................. 102104270 A

(51) Int. Cl.
*H01L 31/02* (2006.01)
*H01L 33/56* (2010.01)
*H01L 27/146* (2006.01)
*H01L 23/00* (2006.01)

(52) U.S. Cl.
CPC ................ *H01L 33/56* (2013.01); *H01L 24/97* (2013.01); *H01L 27/14618* (2013.01); *H01L 27/14683* (2013.01); *H01L 2224/48091* (2013.01); *H01L 2224/48227* (2013.01); *H01L 2924/12041* (2013.01); *H01L 2924/18165* (2013.01)

(58) Field of Classification Search
CPC ...... H01L 31/0203; H01L 31/56; H01L 31/18
USPC ................... 257/99, 433; 438/26, 64
See application file for complete search history.

(56) References Cited

U.S. PATENT DOCUMENTS

| | | | |
|---|---|---|---|
| 7,183,589 B2 * | 2/2007 | Kameyama et al. | 257/100 |
| 8,586,422 B2 * | 11/2013 | Camacho et al. | 438/127 |
| 2003/0222333 A1 * | 12/2003 | Bolken et al. | 257/678 |
| 2004/0080642 A1 * | 4/2004 | Kobayashi et al. | 348/294 |

* cited by examiner

Primary Examiner — Roy Potter
Assistant Examiner — Paul Patton

(57) ABSTRACT

An optoelectronic package includes an optoelectronic chip, a transparent protection layer and a plurality of pads. The optoelectronic chip has an upper surface and an active area defined on the upper surface. The transparent protection layer is connected to the optoelectronic chip and covers the upper surface. The transparent protection layer touches and is entirely attached to the active area. The pads are electrically connected to the optoelectronic chip.

22 Claims, 16 Drawing Sheets

OPTOELECTRONIC PACKAGE AND METHOD OF MANUFACTURING THE SAME

BACKGROUND

1. Field of the Invention

The instant disclosure relates to a semiconductor package and method of manufacturing the same; in particular, to an optoelectronic package and method of manufacturing the same.

2. Description of Related Art

Currently image sensors, for example, CMOS image sensor (CIS), have a housing, a chip and a carrier. The housing defines a receiving space, and the housing and the chip are disposed on the carrier. The housing covers the entire chip, and the chip is received by the receiving space. After the housing and the chip are disposed on the carrier, the receiving space forms a sealed cavity, and air remains in the cavity.

Specifically, the housing usually includes a frame and a glass plate. The receiving space is defined by the frame and the glass plate. After the housing and the chip are disposed on the carrier, the frame surrounds the chip, and the glass plate is disposed directly above an active area of the chip. A transparent plate does not touch the active area, and air remains between the transparent plate and the active area. As a result, external light travels through the transparent plate and enters the active area. The chip can therefore detect the light from outside.

Conventional housing is attached to the carrier by thermosetting glue. In the process of disposing the housing on the carrier, the housing is temporarily attached to the carrier by uncured thermosetting glue. Following that, the thermosetting glue is heated to cure. The housing or the carrier has exhaust holes to allow the air being released, such that the heated air within the housing does not swell and bursts. In addition, after the deposition of the housing, the exhaust holes are sealed by filling glue, so as to prevent moisture or dust from entering the housing and interfering with the chip operation.

BRIEF SUMMARY OF THE INVENTION

The instant disclosure provides an optoelectronic package having a transparent protection layer, and the transparent protection layer covers and touches an active area of the optoelectronic package.

The instant disclosure also provides a method of manufacturing the optoelectronic package.

According to one embodiment of the instant disclosure, the optoelectronic package includes an optoelectronic chip, a transparent protection layer and a plurality of pads. The optoelectronic chip has an upper surface and an active area defined on the upper surface. The transparent protection layer is connected to the optoelectronic chip and covers the upper surface. The transparent protection layer touches and is entirely attached to the active area. The pads are electrically connected to the optoelectronic chip.

According to another embodiment of the instant disclosure, a method of manufacturing optoelectronic package is provided. Firstly, a chip assembly is provided. The chip assembly includes an optoelectronic chip, a plurality of pads electrically connected to the optoelectronic chip and a substrate. The optoelectronic chip and the pads are disposed on the substrate, and the optoelectronic chip has an upper surface and an active area defined on the upper surface. Subsequently, a transparent material covers on the chip assembly. The transparent material covers the upper surface and the entire active area. Following that, the transparent material is cured, such that the transparent material is transferred into a transparent protection layer.

Accordingly, the transparent protection layer covers and touches the active area of the optoelectronic chip. In this regard, any gap or cavity does not remain inside the optoelectronic package, and the transparent protection layer seals the package so as to protect the optoelectronic chip.

In order to further understand the instant disclosure, the following embodiments are provided along with illustrations to facilitate the appreciation of the instant disclosure; however, the appended drawings are merely provided for reference and illustration, without any intention to be used for limiting the scope of the instant disclosure.

DETAILED DESCRIPTION OF THE INVENTION

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Figure 1A:
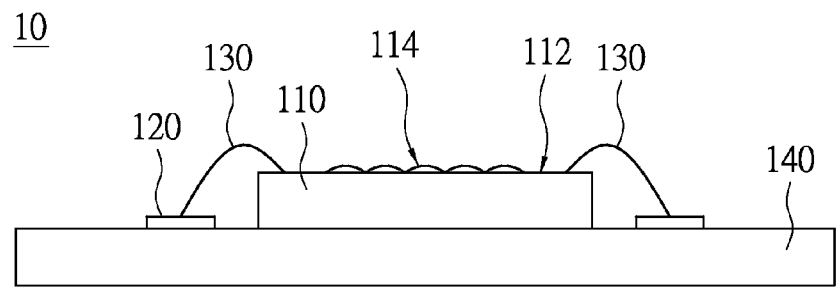
FIGS. 1A to 1D are cross-sectional views showing a method of manufacturing optoelectronic package in accordance with a first embodiment of the instant disclosure.
Figure 1B:
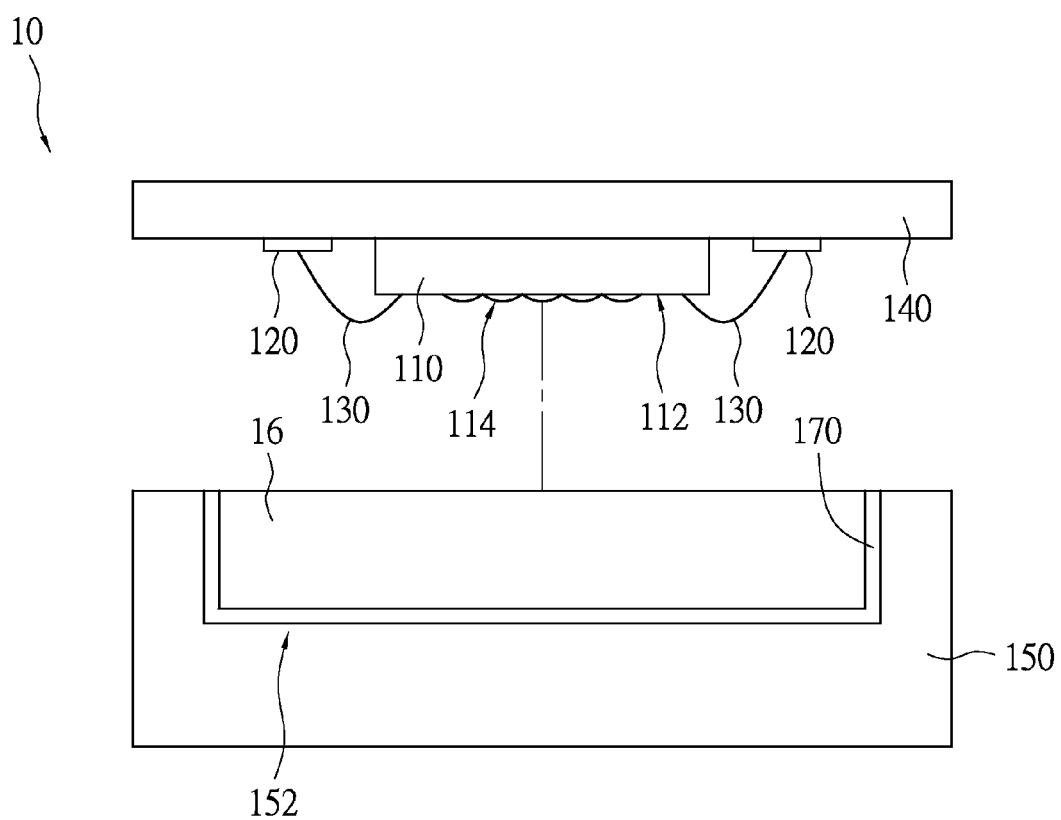
Figure 1C:
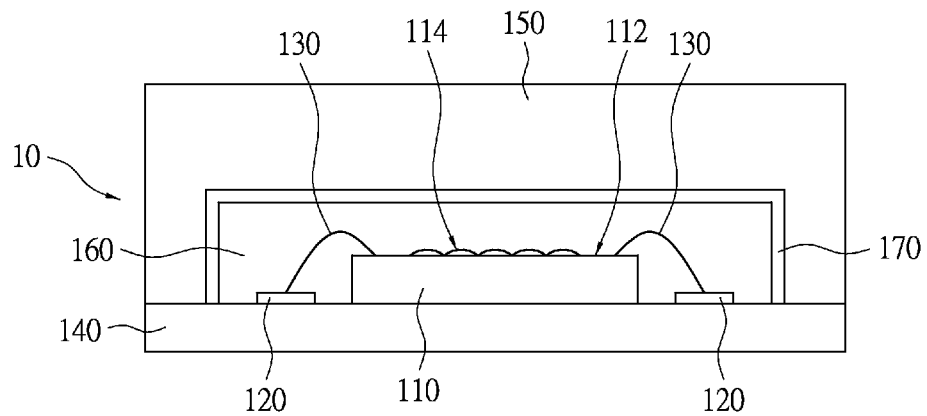
Figure 1D:
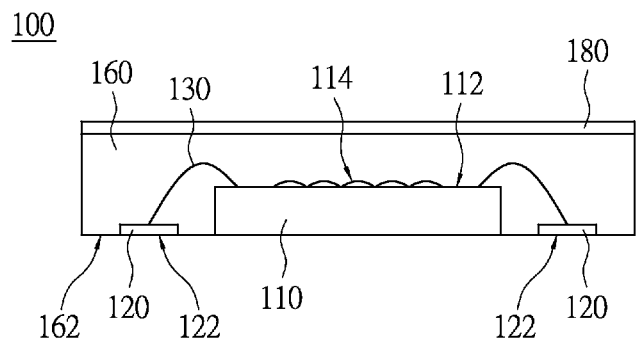

FIGS. 1A to 1D are cross-sectional views showing a method of manufacturing optoelectronic package in accordance with a first embodiment of the instant disclosure. Please refer to FIG. 1D showing a complete optoelectronic package 100 of a first embodiment. The structure of the optoelectronic package 100 is elaborated hereinafter.

The optoelectronic package 100 includes an optoelectronic chip 110, a transparent protection layer 160 and a plurality of pads 120. The optoelectronic chip 110 may be ready-packed chip or un-packed die. The optoelectronic chip 110 may be a photo-sensing component or a light-emitting component. The photo-sensing component includes image sensor, for example, CIS or charge-coupled device (CCD). The light-emitting component includes, for example, light-emitting diode (LED).

The optoelectronic chip 110 has an upper surface 112 and an active area 114 defined on the upper surface 112. The active area 114 receives light or emits light. When the optoelectronic chip 110 is a photo-sensing component, the active area 114 receives light. When the optoelectronic chip 110 is a light-emitting component, the optoelectronic chip 110 emits light from the active area 114. In other words, the active area 114 is the light emitting face of the light-emitting component.

The transparent protection layer 160 connects to the optoelectronic chip 110 and covers the upper surface 112. The transparent protection layer 160 touches and is entirely attached to the active area 114. In the instant embodiment, the transparent protection layer 160 tightly envelops the optoelectronic chip 110 and is entirely attached to the upper surface 112 and active area 114 tightly. As a result, no gap or cavity will be formed between the transparent protection layer 160 and the optoelectronic chip 110. In addition, the material of the transparent protection layer 160 contains amide resin.

In the instant embodiment, the transparent protection layer 160 may be colorless and has high light permeability. The light permeability may fall between 90 to 100%, for example, 99%. However, in another embodiment, light absorbent material, for example, dye, may also be mixed in the transparent protection layer 160, such that the transparent protection layer 160 can filter different lights. More specifically, the transparent protection layer 160 can reject some light (for example, ultra violet light and the other invisible light), and only the light in a certain range of wavelength (for example, red or green light) may pass. Therefore, the transparent protection layer 160 may be transparent and colored, and the instant disclosure is not limited thereto.

Additionally, in the instant embodiment, the optoelectronic package 100 includes a light filter layer 180 disposed on the transparent protection layer 160. The light filter layer 180 can filter out, for example, infrared light, ultraviolet light or the other invisible light. More specifically, the light filter layer 180 may have a plurality of filtering materials, for example, titanium dioxide particles and/or photocatalysis. These filtering materials can absorb infrared light and block the infrared light from passing the transparent protection layer 160 and entering the optoelectronic chip 110.

Certainly, according to practical requirement, the filtering materials may be different from titanium dioxide particles or photocatalysis. In addition to titanium dioxide particles and/or photocatalysis, the light filter layer 180 may further include another filtering material. The light filtering layer 180 may be a film absorbing ultraviolet light. Alternatively, the optoelectronic package 100 may not include the light filtering layer 180. The light filtering layer 180 shown in FIG. 1D does not intend to limit the scope of the instant disclosure.

On the other hand, when the optoelectronic chip 110 is a light-emitting component, the transparent protection layer 160 may have fluorescent materials, such that the transparent protection layer 160 exhibits fluorescent effect. In this regard, the wavelength of the light emitted by the light-emitting component can be changed by the transparent protection layer 160. For example, given the optoelectronic chip 110 is a blue light-emitting diode. When the transparent protection layer 160 is mixed with yellow fluorescent material, a portion of the blue light emitted by the optoelectronic chip 110 is converted to yellow light. As a result, the optoelectronic package 100 emits white light.

The pads 120 are electrically connected to the optoelectronic chip 110. In the instant embodiment, the pads 120 are wire bonded onto the optoelectronic chip 110. Specifically, the optoelectronic package 100 includes a plurality of bonding wires 130. The bonding wires 130 connect the optoelectronic chip 110 and the pads 120, such that signals can be transmitted through the bonding wires 130 between the optoelectronic chip 110 and the pads 120.

The transparent protection layer 160 touches and envelops the bonding wires 130 and the pads 120. The transparent protection layer 160 completely envelops the bonding wires 130 and a portion of the pads 120. In more detail, a bottom 122 of the pads 120 is not covered by the transparent protection layer 160 and exposed on a bottom face 162 of the transparent protection layer 160. In this regard, the soldering ball and the like (not shown) can be attached to the bottoms 122 of the pads 120. The optoelectronic package 100 is welded on the circuit board (not shown) through the soldering ball and electrically connected thereto.

It should be noted that in FIG. 1D the pads 120 are wire bonded to be electrically connected to the optoelectronic chip 110. In another embodiment, the pads 120 and the optoelectronic chip 120 may be electrically connected by flip chip. That is to say, the optoelectronic chip 120 is electrically connected to the pads 120 by a plurality of soldering blocks (for example, soldering balls). The soldering blocks and the pads 120 are disposed underneath the optoelectronic chip 110. The transparent protection layer 160 covers and touches the soldering blocks. The bonding wires 130 in FIG. 1D are for exemplary purpose alone, and the instant disclosure is not limited thereto.

Next please refer to FIGS. 1A to 1D. A method of manufacturing optoelectronic package 100 is described hereinafter.

Please refer to FIG. 1A. In the method of manufacturing the optoelectronic package 100, firstly, a chip assembly 10 is provided. The chip assembly 10 includes the optoelectronic chip 110, the plurality of pads 120 and a substrate 140. The optoelectronic chip 110 and the pads 120 re disposed on the substrate 140, and the pads 120 are electrically connected to the optoelectronic chip 110.

Specifically, the pads 120 are connected to the optoelectronic chip 110 by bonding wires 130. Namely, the electrical connection between the pads 120 and the optoelectronic chip 110 can be established by wire bonding. However, the pads 120 may also be electrically connected to the optoelectronic chip 110 by soldering balls. In other words, the pads 120 and the optoelectronic chip 110 may be electrically connected by flip chip. In addition, the pads 120 may be formed by deposition, photolithography or etching. The deposition includes sputtering, electroless plating or electro plating.

The substrate 140 includes different types of substrates. In the first embodiment, the substrate 140 includes two different materials. The first type of substrate 140 is a metal plate, and the pads 120 are formed on the metal plate (i.e., the substrate 140) and touch the metal plate. The metal material of the pads 120 is different from the metal plate. For example, the pads 120 may be made of cupper, while the metal plate is made of nickel.

The second type of the substrate 140 has at least two layers. The second type of the substrate 140 includes a board and a polymer film (neither is shown). The board can be a hard plate, for example, a metal sheet, glass plate or ceramic plate, whereas the polymer film can be polyimide (PI) or polyethylene terephthalate (PET). The pads 120 is formed on the polymer film and touch the polymer film. In other words, the polymer film is sandwiched between the pads 120 and the board.

Please refer to FIGS. 1B and 1C. Subsequently, a transparent material 16 covers the chip assembly 10, such that the upper surface 112 and active area 114 are entirely laminated. Next, the transparent material 16 is cured, such that the transparent material 16 is converted to the transparent protection layer 160. As shown in FIG. 1C, the transparent material 16 may be cured by heating up or exposure to the light (e.g. ultraviolet light). Additionally, the transparent material 16 may contain amide resin, and the transparent material 16 is commercially available.

The transparent material 16 covers the chip assembly 10, and the detail process is elaborated hereinafter. Please refer to FIGS. 1B and 1C, the transparent material 16 is formed on a transparent substrate 150. The transparent substrate 150 has a recess 152, and the transparent material 16 is formed in the recess 152. Specifically, the transparent substrate 150 may be made of glass of plastic, and the recess 152 is formed by chemical etching or mechanical force. The transparent material 16 may be in liquid state and running to allow the filling into the recess 152.

Before the transparent material 16 fills in the recess 152, a release layer 170 may be formed in the recess 152. The release layer 170 completely covers the wall and bottom of the recess 152, and the material of the release layer 170 may be polymer, for example, PI or PET. Following that, the transparent material 16 fills in the recess 152 and covers the release layer 170.

After the transparent material 16 is formed on the transparent substrate 150, the chip assembly 10 can be turned over, such that the optoelectronic chip 110 faces down toward the recess 152. Subsequently, the chip assembly 10 and the transparent substrate 150 move toward each other, so as to dip the optoelectronic chip 110 in the transparent material 16 in the recess 152. Because the transparent material 160 is in a liquid state, the transparent material 16 covers the chip assembly 10 and tightly envelops the optoelectronic chip 110 as well as the bonding wires 130.

Please refer to FIGS. 1B and 1C. After the optoelectronic chip 110 is dipped in the transparent material 16, the transparent material 16 is heated up or exposed to light (e.g., ultraviolet light) for curing. Then, the transparent layer 160 is formed as solid. Namely, the transparent layer 160 does not exhibit the property of running. Because the transparent layer 160 is not running, the chip assembly 10 can flip again after the formation of the transparent layer 160. The optoelectronic chip 110 and the transparent substrate 150 are then on the substrate 140 as shown in FIG. 1c.

Please refer to FIGS. 1C and 1D. Afterwards, the substrate 140, transparent substrate 150 and the release layer 170 are removed. The optoelectronic package 100 is then complete. The removal of the substrate 140 can be achieved by etching or peeling because the substrate 140 is a metal plate or a polymer film along with a plate which touches the pads 120.

More specifically, when the substrate 140 is a metal plate, the substrate 140 can be removed by etchant because the substrate 140 and the pads 120 are made of different metallic materials. When the substrate 140 is a polymer film along with a plate, the plate can be peeled from the polymer film, and the polymer film can be removed by dissolved in organic solvent.

The bond between the release layer 170 and transparent protection layer 160 is smaller than that between the release layer 170 and the transparent substrate 150, such that the transparent substrate 150 can be peeled off from the release layer 170. In addition, the release layer 170 can be made of PI or PET, such that the release layer 170 can be dissolved in organic solvent. Accordingly, the release layer 170 can be removed from the transparent substrate 150 by peeling or dissolving.

Please refer to FIG. 1D. Additionally, after removing the substrate 140, the transparent substrate 150 and the release layer 170, a light filter layer 180 is formed on the transparent protection layer 160. The light filter layer 180 may be formed by sintering. However, the light filter layer 180 is an optional component to the optoelectronic package 100, and therefore the instant embodiment does not go into the detail of the light filter layer 180 formation.

Because the transparent material 16 tightly envelops the optoelectronic chip 110 and the bonding wires 130, after the transparent material 16 is cured to form the transparent protection layer 160, the transparent protection layer 160 is entirely and closely attached to the active area 114 of the optoelectronic chip 110. In between the transparent protection layer 160 and the optoelectronic chip 110, no gaps or cavities are formed, and no air is present. Therefore, moisture or dust is prevented from entering the optoelectronic chip 110 because the transparent protection layer 160 blocks their entry. Furthermore, the optoelectronic package 100 does not need to have exhaust holes in the instant embodiment.

Figure 2A:
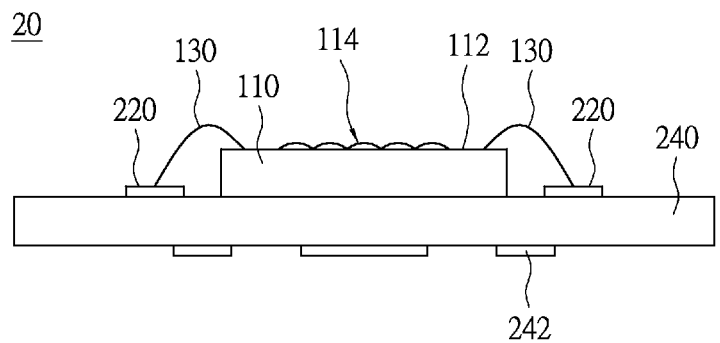
FIGS. 2A to 2C are cross-sectional views showing a method of manufacturing optoelectronic package in accordance with a second embodiment of the instant disclosure.
Figure 2B:
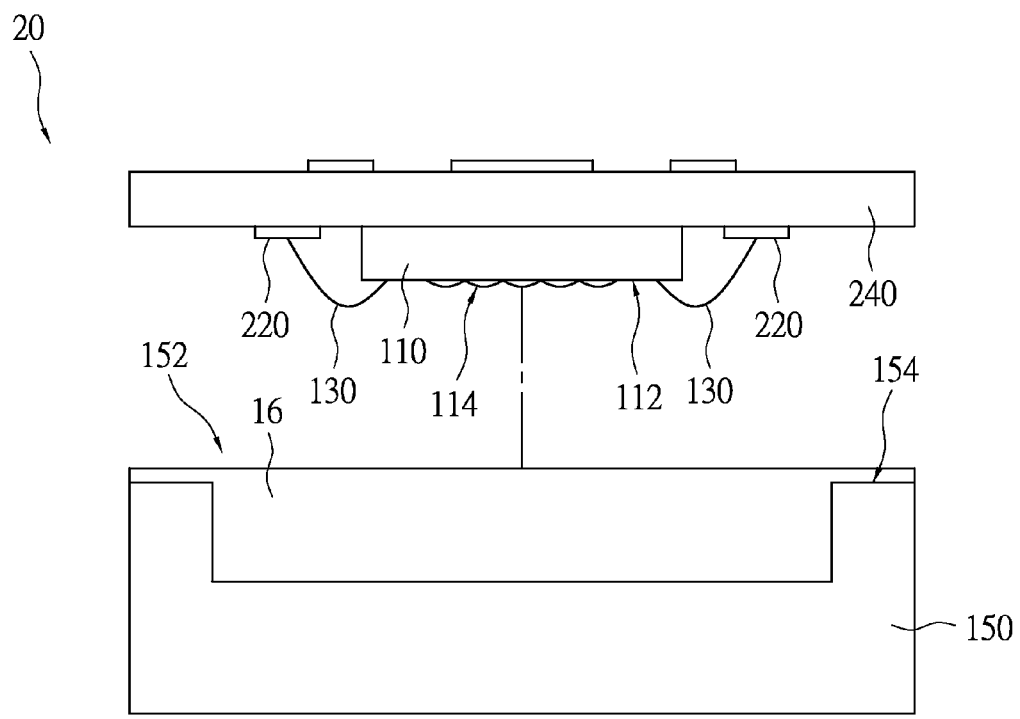
Figure 2C:
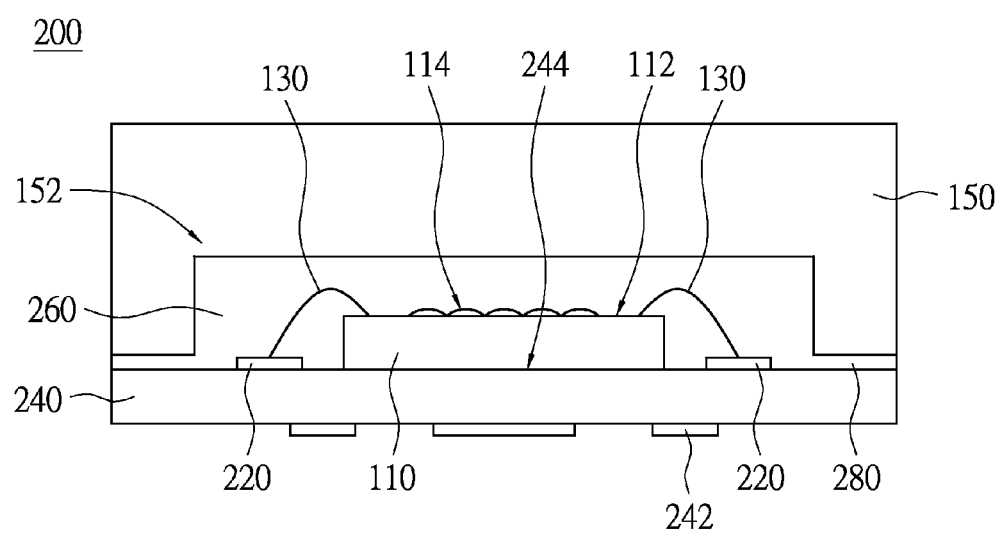

FIGS. 2A to 2C are cross-sectional vies showing the method of manufacturing the optoelectronic package in accordance with a second embodiment of the instant disclosure. FIG. 2C shows a nearly complete optoelectronic package 200 of the second embodiment. The structure of the optoelectronic package 200 is elaborated hereinafter.

Please refer to FIG. 2C. The optoelectronic package 200 includes the optoelectronic chip 110, the plurality of bonding wires 130, the plurality of pads 220 and the transparent protection layer 260. The optoelectronic package 200 and the optoelectronic package 100 have similar structure and function and use similar material. For example, the pads 220 and pads 120 are made of the same material and the configuration is identical. The transparent protection layer 260 and the transparent protection layer 160 are made of the same material, the transparent material 16. (Please refer to FIG. 1B.) However, the difference between the optoelectronic package 200 and the optoelectronic package 100 lies in the substrates. The optoelectronic package 200 further includes a transparent substrate 150 and a substrate 240.

The substrate 240 is a circuit bard and has an outer circuit 242, an assembly surface 244 and an inner circuit (not shown). The pads 220 and the optoelectronic chip 110 are disposed on the assembly surface 244. The inner circuit has at least one blind-via structure or a through-hole structure. Through the blind-via structure or the through-hole structure, the inner circuit electrically connects between the outer circuit 242 and the pads 220, such that the outer circuit 242 and the pads 220 are electrically connected. Moreover, the outer circuit 242 includes a plurality of traces (not shown) and a plurality of pads (not shown). The pads of the outer circuit 242 are used in welding for connecting the mother board or the like.

In the second embodiment, the bonding wires 130 connect between the pads 220 and the optoelectronic chip 110. Namely, the optoelectronic chip 110 wire bonds to the pads 220 for electrical connection. However, in another embodiment, the optoelectronic chip 110 may be electrically connected to the pads 220 by flip chip. The instant embodiment does not intend to limit the connection method between the optoelectronic chip 110 and the pads 220.

Furthermore, because the pads 220 are electrically connected to the substrate 240 and the optoelectronic chip 110 is electrically connected to the pads 220, signals can be transmitted between the optoelectronic chip 110 and the substrate 240 via the bonding wires 130 and the pads 220. The optoelectronic chip 110, pads 220, bonding wires 130 and substrate 240 are integrated as a circuit board assembly.

The transparent substrate 150 is formed with the recess 152, and the optoelectronic chip 110 and the pads 220 are disposed in the recess 152. The transparent protection layer 260 fills in the recess 152 and covers the optoelectronic chip 110 and the pads 220. In addition, the transparent protection layer 260 connects the optoelectronic chip 110 and covers the upper surface 112 thereof. In this regard, the transparent protection layer 260 touches the active area 114 and entirely attached thereto. There is not a gap or cavity formed between the transparent protection layer 260 and the optoelectronic chip 110. Additionally, the transparent protection layer 260 touches and connects to the assembly surface 244.

The transparent substrate 150 is disposed on the assembly surface 244 of the substrate 240. The optoelectronic package 200 further includes a connection layer 280 for connecting the transparent substrate 150 and the substrate 240. Specifically, the connection layer 280 may be annular, disposed outside the recess 152 and connected to the substrate 240 and the transparent substrate 150. The connection layer 280 may be made of the identical material as the transparent protection layer 260. The connection layer 280 and the transparent protection layer 260 may be both made of the transparent material 16.

Attention is now invited to FIGS. 2A to 2C. The method of manufacturing the optoelectronic package 200 is described hereinafter.

Please refer to FIG. 2A. Firstly, a chip assembly 20 is provided. The chip assembly 20 includes the optoelectronic chip 110, the pads 220 and the substrate 240. The optoelectronic chip 110 and the pads 220 are disposed on the substrate 240, and the pads 220 are electrically connected to the optoelectronic chip 110. The optoelectronic chip 110 is mounted on the substrate 240, such that the chip assembly 20 is a circuit board assembly.

The pads 220 may be connected to the optoelectronic chip 110 by bond wires 130. Namely the pads 220 and the optoelectronic chip 110 are connected by wire bonding. However, the connection therebetween may also be achieved by flip chip. The formation of the pads 220 is identical to the pads 120 in the first embodiment.

Please refer to FIGS. 2B and 2C. Subsequently, the transparent material 16 covers on the chip assembly 20, such that the active area 114 is entirely covered as well as the upper surface 112. Next, the transparent material 16 is cured. After curing, the transparent material 16 is converted into the transparent protection layer 160 as shown in FIG. 2C. The transparent material 16 can be cured by heating or exposure to light (e.g. ultraviolet light).

In the second embodiment, the transparent material 16 covers the chip assembly 20 by the following process. Please refer to FIG. 2B. The transparent material 16 is formed on the transparent substrate 150. The transparent material 16 is formed in the recess 152 and a face 154 of the transparent substrate 150. The recess 152 is also exposed on the face 154. Therefore, the transparent material 16 covers the recess 152 and the remaining area (i.e., the face 154), as shown in FIG. 2B.

Next, the chip assembly 20 is turned over, such that the optoelectronic chip 110 faces downward toward the recess 152. Then the chip assembly 20 and the transparent substrate 150 move toward each other, and the optoelectronic chip 110 dips into the transparent material 16 in the recess 152. Therefore, the transparent material 16 covers the chip assembly 20 and tightly envelops the optoelectronic chip 110 and the bonding wires 130.

Please refer to FIGS. 2B and 2C. After the optoelectronic chip 110 dips into the transparent material 16, the transparent material 16 is heated up or exposed to the light (e.g. ultraviolet light). Following that, the transparent material 16 is converted into the transparent protection layer 260. Then the chip assembly 20 is flipped again, such that the optoelectronic chip 110 and the transparent substrate 150 are on the substrate 240, as shown in FIG. 2C. So far, the optoelectronic package 200 is complete. Accordingly, the difference between the method of manufacturing the optoelectronic package 200 and 100 lies in the release layer 170 and the substrate 240. In the second embodiment, the transparent substrate 150 is not removed by the release layer 170. Also, the substrate 240 where the optoelectronic chip 110 is disposed is a circuit substrate.

It is worth mentioning that although in the second embodiment, the transparent substrate 150 and the substrate 240 are not removed, a person skill in the art should understand the possible alternative between the first and the second embodiments. More specifically, the substrate 240 in the second embodiment may be changed as the substrate 140 which does not have any circuits thereon. The release layer 170 may also be used to remove the transparent substrate 150. As a result, the optoelectronic package 200 may be produced without the substrate 240 or the transparent substrate 150. In short, the methods of manufacturing the optoelectronic packages 100, 200 are interchangeable.

Figure 3A:
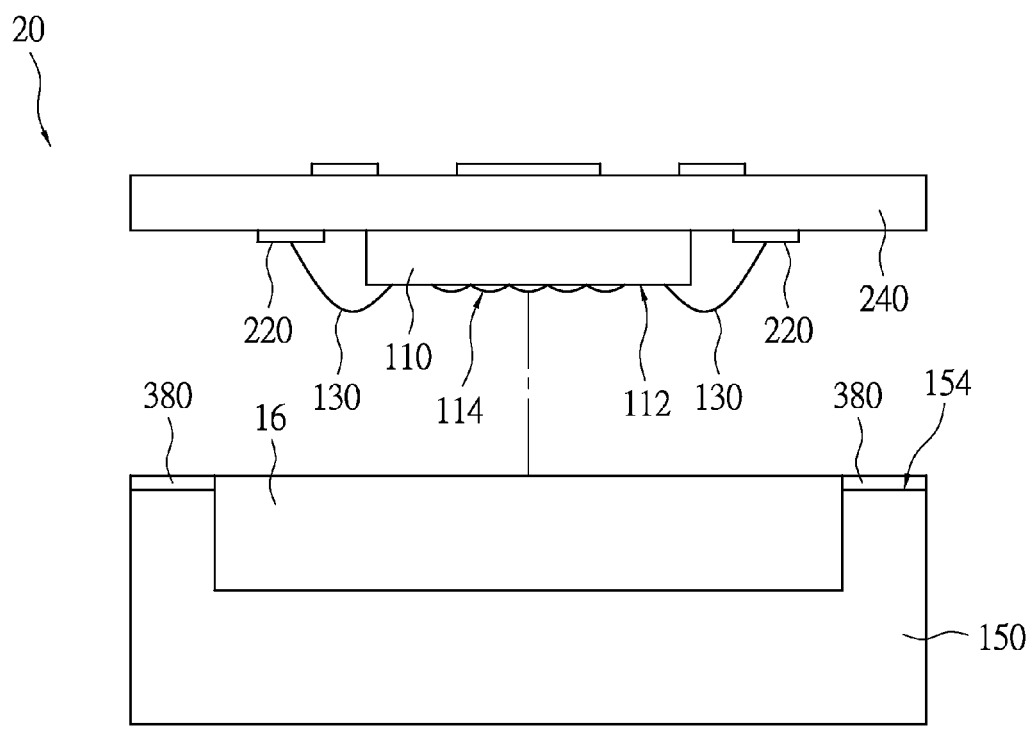
FIGS. 3A to 3B are cross-sectional views showing a method of manufacturing optoelectronic package in accordance with a third embodiment of the instant disclosure.
Figure 3B:
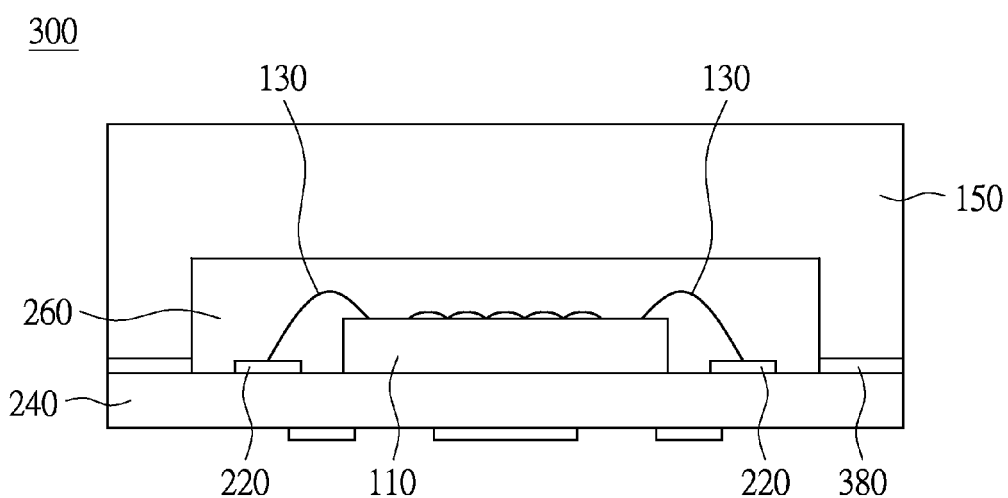

FIGS. 3A to 3B are cross-sectional views showing the method of manufacturing optoelectronic package in accordance with a third embodiment of the instant disclosure. Please refer to FIGS. 3A and 3B. An optoelectronic package 300 of the third embodiment and the optoelectronic package 200 of the second embodiment have the same function. The structure and the method of manufacturing the optoelectronic packages are similar. The difference between the optoelectronic packages 200, 300 is described hereinafter, and the identical features are not repeated hereinafter.

Please refer to FIG. 3B. The difference between the optoelectronic packages 200, 300 is: The connection layer 380 of the optoelectronic package 300 is made of different material from the transparent protection layer 260. The connection layer 380 may be made of adhesive, for example, resin. The resin may contain silyl resin having silicon oxide or thermosetting resin.

Please refer to FIG. 3A. The method of manufacturing the optoelectronic packages 200, 300 are almost identical. Only that when the transparent material 16 covers the chip assembly 20, the connection layer 380 is formed on the face 154 of the transparent substrate 150. The connection layer 380 may be formed by coating the adhesive. Therefore, in the third embodiment, the transparent material 16 does not touch the face 154.

Figure 4A:
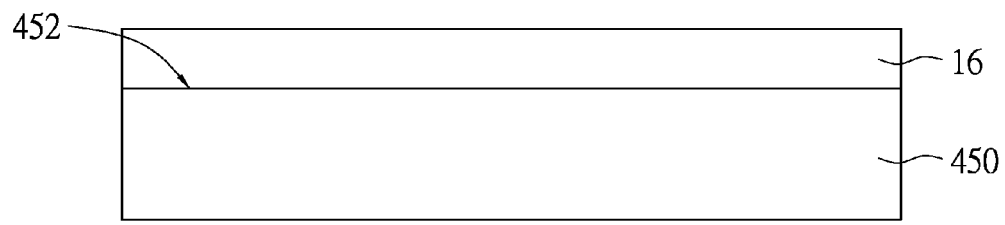
FIGS. 4A to 4C are cross-sectional views showing a method of manufacturing optoelectronic package in accordance with a fourth embodiment of the instant disclosure.
Figure 4B:
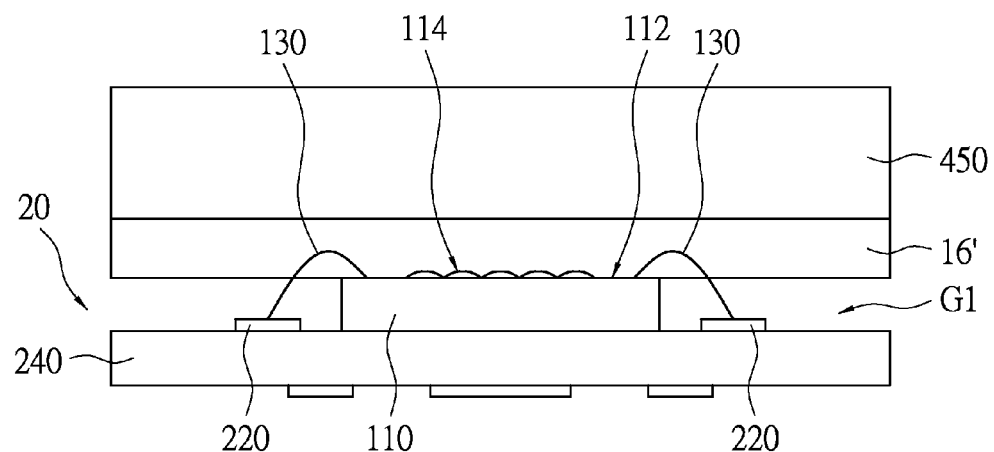
Figure 4C:
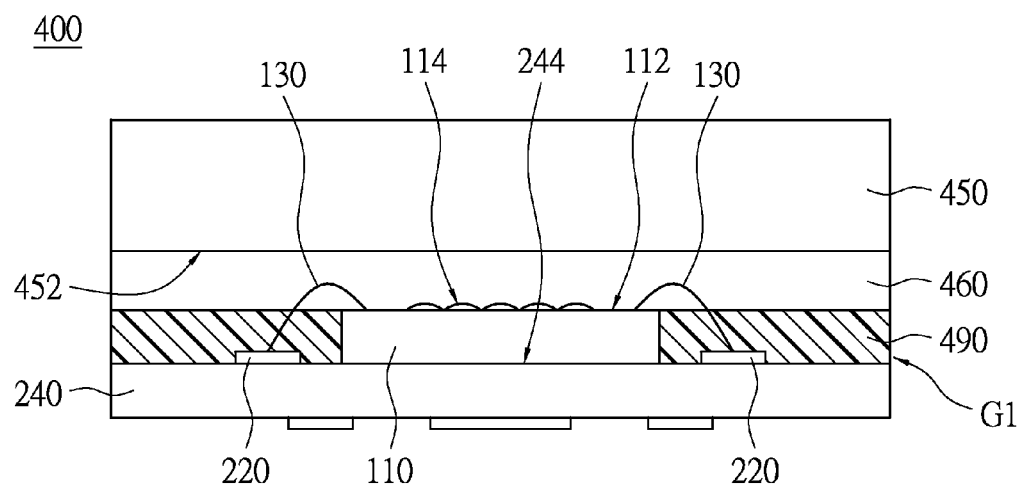

FIGS. 4A to 4C are cross-sectional vies showing the method of manufacturing optoelectronic package in accordance with a fourth embodiment of the instant embodiment. Please refer to FIG. 4C showing a nearly complete optoelectronic package 400. The optoelectronic package 400 of the fourth embodiment and the optoelectronic package 200 of the second embodiment are very similar in structure and method of making. Only the difference between the optoelectronic packages 200, 400 is emphasized hereinafter.

In addition to the optoelectronic chip 110, the pads 220, the substrate 240, the bonding wires 130, the transparent substrate 450 and the transparent protection layer 460, the optoelectronic package 400 further includes a dam 490. The dam 490 surrounds the optoelectronic chip 110 and touches the transparent protection layer 460 and the optoelectronic chip 110. In addition, the dam 490 can be made of molding compound.

The transparent substrate 450 and the transparent substrate 150 are made of the same material, glass plate or plastic plate. The transparent substrate 450 has the face 452, but unlike the second embodiment, the transparent substrate 450 does not have any recess 152 exposed on the face 452. Furthermore, the transparent substrate 450 is disposed on the transparent protection layer 460 and connects thereto.

The transparent protection layer 460 and the transparent protection layer 260 are made of the same material. The transparent protection layer 460 is made of the transparent material 16. However, the configuration of the protection layers 460, 260 are different, and the transparent protection layer 460 only covers the upper surface 112 of the optoelectronic chip 110 not the assembly surface 244 of the substrate 240.

The optoelectronic chip 110, dam 490 and the transparent protection layer 460 are disposed between the transparent substrate 450 and the circuit substrate 240. The transparent protection layer 460 is flanked between the transparent substrate 450 and the dam 490 as well as the optoelectronic chip 110. The transparent protection layer 460 touches a portion of the bonding wires 130 instead of the entire bonding wires 130. The remaining portion of the bonding wires 130 is covered by the dam 490.

Attention is now invited to FIGS. 4A to 4C. The method of manufacturing optoelectronic package 400 is described hereinafter.

Please refer to FIG. 4A. The transparent material 16 is formed on the transparent substrate 450 and entirely covers the face 452. Because the transparent material 16 is in liquid state, the transparent material 16 can be formed by spreading or printing. Namely, the transparent material 16 is spread on a spreading layer of the transparent substrate 450.

Please refer to FIGS. 4A and 4B. Net, the spreading layer (i.e., the transparent material 16) is prebaked, such that the transparent material 16' is less running. This phase state is designated as, for example, B-stage, and the prebaking may be conducted in a different phase other than the B-stage.

In the process of preheating the transparent material 16, the transparent material 16 is heated, but the temperature does not exceed the curing temperature. Therefore, although the transparent material 16 is less running or even immobile, the transparent material 16' is not the final cured transparent material 16. The transparent material 16' exhibits considerable flexibility. Furthermore, there are different ways to form the less running transparent material 16', and prebaking is only one of them. For example, the transparent material 16' may be formed by exposure to ultraviolet light. Hence, the formation of transparent material 16' by prebaking is an example, and the instant disclosure is not limited thereto.

Afterward, the transparent material 16' is pressed onto the chip assembly 20, such that the active area 114 of the optoelectronic chip 110 is covered. Because the transparent material 16' exhibits considerable flexibility, when the transparent material 16' is pressed, the bonding wires 130 will not be crashed by the transparent material 16'. In contrast, the bonding wires 130 are naturally embedded into the transparent material 16', as shown in FIG. 4B. After the press of the transparent material 16', a gap G1 is formed between the transparent material 16' and the substrate 240.

It is worth nothing that the transparent material 16' may also be formed on the transparent substrate 450 by attachment. That is to say, the transparent material 16' may be a dry film which can be attached to the face 452 of the transparent substrate 450. Accordingly, the process of forming the transparent material 16' is not limited to spreading and prebaking.

Please refer to FIGS. 4B and 4C. After the transparent material 16' is pressed onto the chip assembly 20, the transparent material 16' is cured, such that the transparent material 16' is converted into the transparent protection layer 460. The transparent protection layer 460 is attached to the upper surface 112 of the optoelectronic chip 110. The transparent material 16' may be heated of exposed to the light (e.g. ultraviolet light) so as to be cured. Moreover, the transparent protection layer 460 is harder than the transparent material 16'. Therefore, after the formation of the transparent protection layer 460, the bonding wires 130 are embedded and secured within the transparent protection layer 460.

The transparent material 16' in the instant embodiment exhibits the following property. Before the transparent material 16' is cured, the degree of running of the transparent material 16' varies according to the temperature. This change is reversible. However, once the transparent material 16' is cured, it starts the processing to convert into the transparent protection layer 460. The transparent protection layer 460 is not running and does not change along with temperature. In other words, the transparent protection layer 460 will not become liquid again or softened, and the curing process is irreversible.

For example, given the curing temperature is 150° C. In the process of heating yet not curing the transparent material 16' (i.e., the heating temperature does not exceed 150° C.), when the transparent material 16' reaches about 70° C., the transparent material 16' is less running. When the transparent material 16' reaches about 100° C., although the transparent material 16' is not cured, it is close to not running.

When the transparent material 16' cools down from 100° C. to 70° C., the transparent material 16' remains its flexibility which is close to that at 70° C. Accordingly, as long as the transparent material 16' does not reach the curing temperature, the degree of flexibility thereof is subject to change. Namely, when the temperature does not exceed the curing temperature, the flexibility of the transparent material 16' is changeable.

In addition, when at 70° C., the transparent material 16' remains its flexibility. Therefore, when pressing the transparent material 16' on the chip assembly 20, the transparent material 16' may be heated under about 70° C. Alternatively, the transparent material 16' may be heated under a temperature above 70° C., for example, 100° C., such that the solvent in the transparent material 16' completely evaporates. Following that, the transparent material 16' cools down to about 70° C.

When the transparent material 16' reaches 70° C., the transparent material 16' is pressed onto the chip assembly 20. Because the transparent material 16' remains running, the bonding wires 130 is less likely to be crashed by a solid transparent material 16'. In contrast, the bonding wires 130 are more likely to be embedded within the transparent material 16'.

Subsequently, the molding compound fills into the gap G1 to form the dam 490. The molding compound can be filled by liquid injection to the gap G1. So far, the optoelectronic package 400 is complete. The dam 490 fills the entire gap G1 and therefore touches the transparent protection layer 460 and the optoelectronic chip 110. In addition, the dam 490 covers a portion of the bonding wires 130. In this regard, the dam 490, transparent portion layer 460 and the substrate 240 together seal the optoelectronic chip 110 so as to protect the optoelectronic chip 110 from moisture or dust.

Figure 5A:
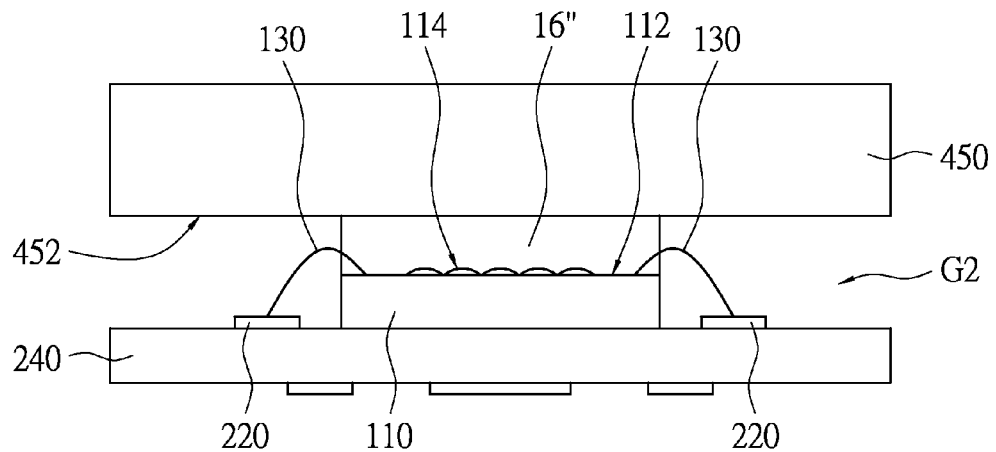
FIGS. 5A to 5B are cross-sectional views showing a method of manufacturing optoelectronic package in accordance with a fifth embodiment of the instant disclosure.
Figure 5B:
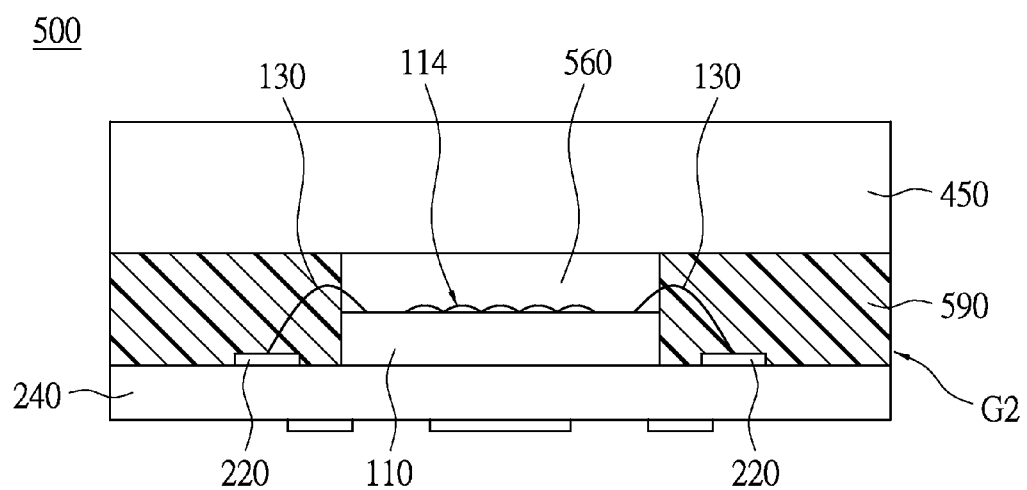

FIGS. 5A to 5B are cross-sectional views showing the method of manufacturing the optoelectronic package in accordance with a fifth embodiment of the instant disclosure. Please refer to FIGS. 5A and 5B. The optoelectronic package 500 of the fifth embodiment and the optoelectronic package 400 of the fourth embodiment have the same function, and the structure and method of making are similar as well. Only the difference between the optoelectronic packages 400, 500 is described hereinafter. The identical features are not repeated.

Please refer to FIG. 5A. The difference between the methods of making the optoelectronic packages 400, 500 lies in the transparent material 16". Specifically, the component, physical and chemical property are the same for both the transparent material 16', 16". However, the transparent material 16" partially covers the face 452 of the transparent substrate 450, unlike FIGS. 4A to 4C. The transparent materials 16, 16" covers the face 452 entirely. On the other hand, a portion of the face 452 is not covered by the transparent material 16".

There are many ways to form the transparent material 16". In the fifth embodiment, the transparent material 16" can be formed by exposing, development or printing on the face 452. The transparent material 16" may contain photo sensitizer, and the printing may be screen printing or ink printing. Also, the transparent material 16" may be a spreading layer after prebaking or a dry film going through exposure and development.

After the transparent material 16" is formed, the transparent material 16" is pressed onto the chip assembly 20 to cover the active area 114 of the optoelectronic chip 110. Because the physical property of the transparent material 16" is the same as the transparent material 16', when the transparent material 16" is pressed, the bonding wires 130 will not be crashed by the transparent material 16". In contrast, the bonding wires 130 are buried in the transparent material 16" instead. Furthermore, after the transparent material 16" is pressed onto the chip assembly 20, a gap G2 is formed between the transparent substrate 450 and the substrate 240.

Please refer to FIGS. 5A and 5B. Next, the transparent material 16" is cured, such that the transparent material 16" is converted into the transparent protection layer 560. The transparent protection layer 560 is attached to the upper surface 112 of the optoelectronic chip 110. The curing process of the transparent material 16" and the transparent material 16' is the same. Meanwhile, the gap G2 surrounds the transparent protection layer 560 and the optoelectronic chip 110. Subsequently, the molding compound fills into the gap G2 to form the dam 590. The molding compound is inserted by liquid injection to the gap G2. So far, the optoelectronic package 500 is complete.

In the optoelectronic package 500, the dam 590 occupies the entire gap G2, such that the dam 590 surrounds the transparent protection layer 560 and the optoelectronic chip 110. The dam 590 touches the transparent protection layer 560, transparent substrate 450 and the optoelectronic chip 110. As a result, the dam 590, transparent protection layer 560 and substrate 240 seal the optoelectronic chip 110 and provide protection thereto against moisture or dust. In addition, the dam 590 is thicker than the optoelectronic chip 110, and the optoelectronic 110, dam 590 and the transparent protection layer 560 are disposed between the transparent substrate 450 and the circuit substrate 240, as shown in FIG. 5B.

FIGS. 6A to 6D are cross-sectional views showing the method of manufacturing optoelectronic package in accordance with a sixth embodiment of the instant disclosure. The optoelectronic package 600 of the sixth embodiment and the optoelectronic package 500 of the fifth embodiment are similar. The difference lies in: the structure and material of a dam 690 of the sixth embodiment are different from those of the dam 590 of the fifth embodiment.

Figure 6A:
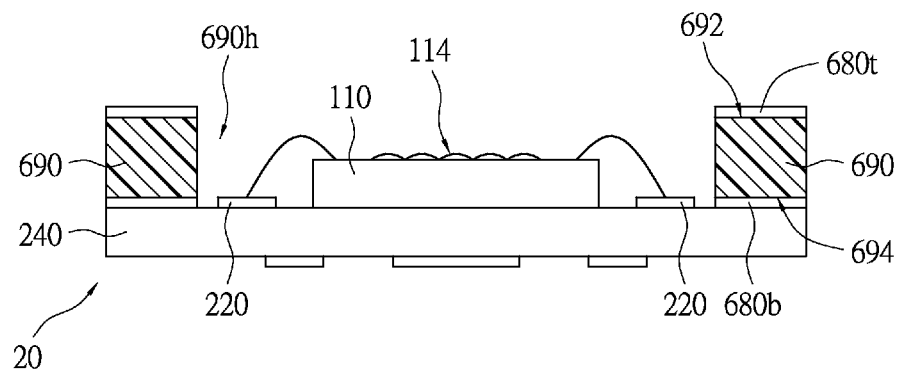
FIGS. 6A to 6D are cross-sectional views showing a method of manufacturing optoelectronic package in accordance with a sixth embodiment of the instant disclosure.
Figure 6B:
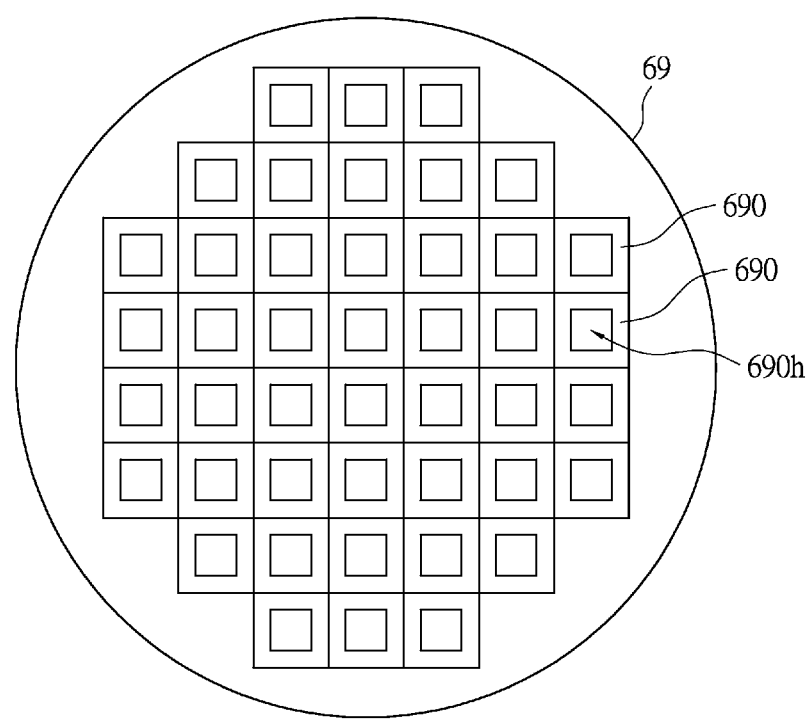
Figure 6C:
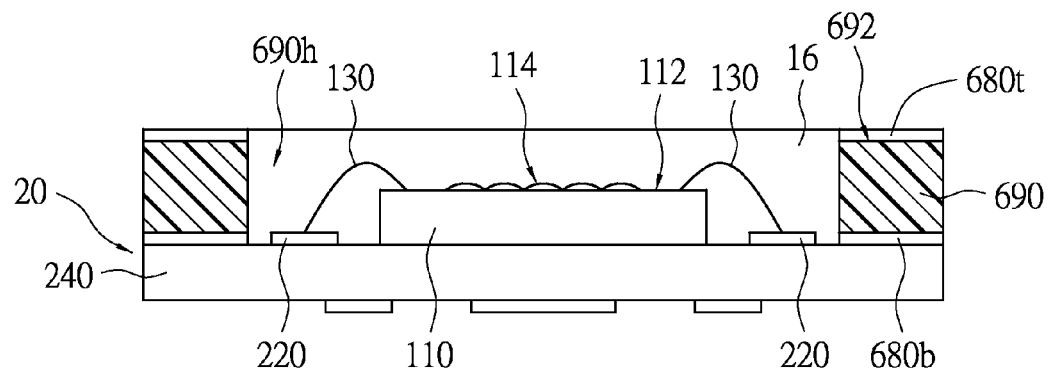
Figure 6D:
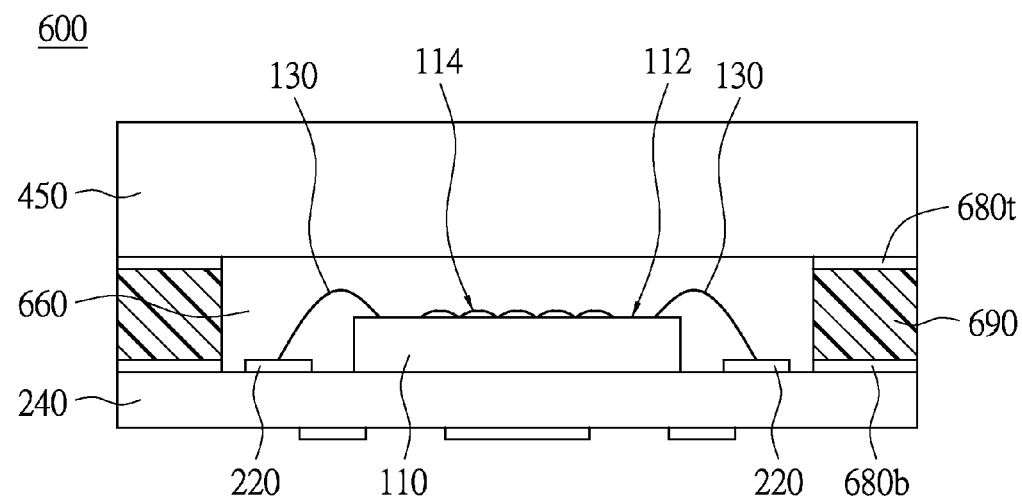

Please refer to FIG. 6D, which shows an almost complete optoelectronic package 600. Like the fifth embodiment, the optoelectronic package 600 includes the optoelectronic chip 110, pads 220, substrate 240, bonding wires 130, transparent substrate 450, dam 690 and transparent protection layer 660. However, unlike the fifth embodiment, the dam 690 of the optoelectronic package 600 is a silicon substrate, and the dam 690 does not touch the optoelectronic chip 110 or cover the bonding wires 130.

Moreover, the optoelectronic package 600 further includes a first connection layer 680t and a second connection layer 680b. The first connection layer 680t connects between the transparent substrate 450 and the dam 690, while the second connection layer 680b connects between the dam 690 and the circuit substrate 240. The first and second connection layers 680t, 680b may be made of the same material, and the material may be the same as the connection layer 380 in the third embodiment. That is to say, the first and second connection layers 680t, 680b may be adhesive containing, for example, silyl resin having silicon oxide or thermosetting resin.

By using the first and second connection layers 680t, 680b, the dam 690 is attached to the transparent substrate 450 and the substrate 240. Because the dam 690 is a silicon substrate and the transparent substrate 450 is a glass plate, the similarity in material minimizes the difference in thermal expansion coefficient. Hence, the dam 690 and the transparent substrate 450 are less likely being structurally damaged by thermal expansion.

In addition, the first and second connection layers 680t, 680b may be made of silyl resin, the dam 690 is a silicon substrate, and the transparent substrate 450 is a glass plate. Silicone is present in the first and second connection layers 680t, 680b, dam 690 and the transparent substrate 450. Therefore the first and second connection layers 680t, 680b, dam 690 and the transparent substrate 450 exhibit great adhesive bonding. In other words, the first and second connection layers 680t, 680b are attached to the dam 690, such that the dam 690 can be secured between the transparent substrate 450 and the substrate 240.

Attention is now invited to FIGS. 6A to 6D. The method of manufacturing optoelectronic package 600 is elaborated hereinafter.

Firstly, the dam 690 is disposed on the substrate 240. The dam 690 resembles a frame having a top face 692, a bottom face 694 and an opening 690h. The opening 690h is exposed on the top face 692, while the optoelectronic chip 110 is disposed in the opening 690h. Furthermore, according to FIG. 6A, the thickness of the dam 690 is thicker than that of the optoelectronic chip 110.

Please refer to FIG. 6B. The dam 690 (i.e., the frame) is made of a silicon substrate 69, and it is shaped annularly. Specifically, the silicon substrate 69 may be for example, a silicon wafer, and the dam 690 is formed by the following process. Firstly, a plurality of openings 690h is formed on the silicon substrate 69 by chemical etching or mechanical fabrication. Subsequently, the silicon substrate 69 is diced to produce a plurality of frames having the openings 690h and so as the dams 690.

Please refer to FIG. 6A. Before the dam 690 is disposed on the substrate 240, the second connection layer 680b is formed on the assembly surface 244 of the circuit substrate 240 or the bottom face 694 of the dam 690. As a result, the dam 690 can be secured on the assembly surface 244 by the second connection layer 680b. Additionally, when the dam 690 is disposed on the substrate 240, the first connection layer 690t is formed on the top face 692 of the dam 690, as shown in FIG. 6A.

Please refer to FIG. 6C. Then, the transparent material 16 is filled in the opening 690h. The formation of the transparent material 16 is identical to the material 16 in the first and second embodiments, and described in the first and second embodiments. Thus, the description of the formation is not repeated. In addition, the transparent material 16 is full to the opening 690h and does not cover and not touch the top face 692 of the dam 690.

Please refer to FIGS. 6C and 6D. Then, the transparent substrate 450 is pressed onto the dam 690 and covers the optoelectronic chip 110. Meanwhile, the transparent substrate 450 touches the transparent material 16 and the first connection layer 680t. Next, the transparent material 16 is cured to form the transparent protection layer 660. The transparent material 16 may be cured by heating or exposure to light (e.g., ultraviolet light). After the transparent material 16 is cured, the optoelectronic package 600 is complete.

In the sixth embodiment, the optoelectronic package 600 includes the transparent protection layer 660 which covers the optoelectronic chip 110. However, even if the optoelectronic package 600 does not include the transparent protection layer 660 (i.e., a cavity is formed inside the optoelectronic package 600), the transparent substrate 450, dam 690, first connection layer 680t, second connection layer 680b and the substrate 240 prevent any moisture or dust from entering the cavity so as to protect the optoelectronic chip 110.

Figure 7A:
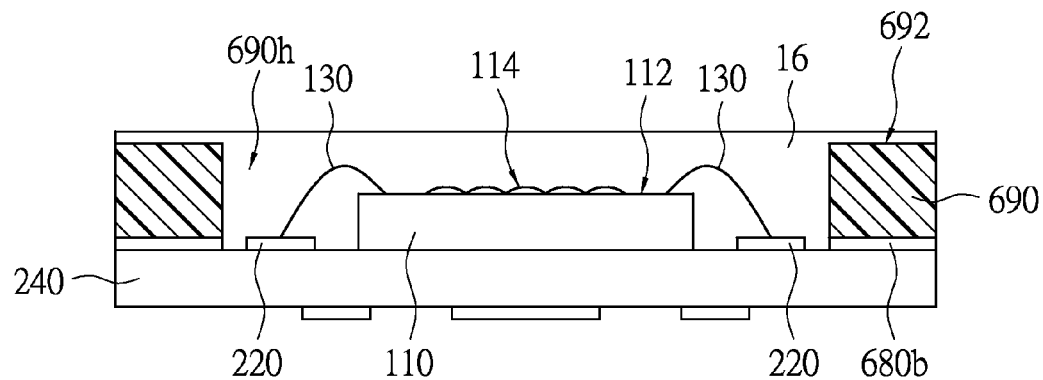
FIGS. 7A to 7B are cross-sectional views showing a method of manufacturing optoelectronic package in accordance with a seventh embodiment of the instant disclosure.
Figure 7B:
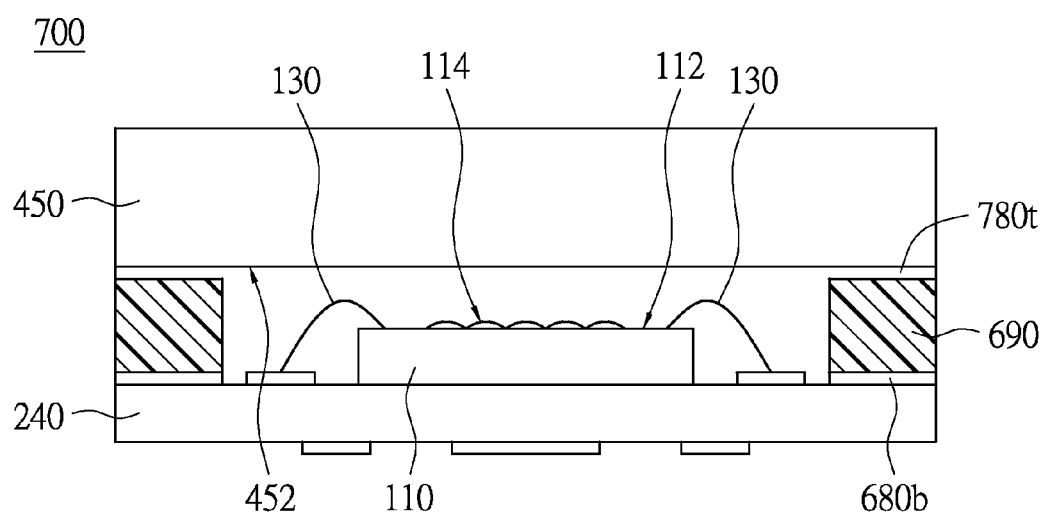

FIGS. 7A and 7B are cross-sectional views showing the method of manufacturing optoelectronic package in accordance of a seventh embodiment of the instant disclosure. Please refer to FIGS. 7A and 7B. The functions of the optoelectronic package 700 of the seventh embodiment and the optoelectronic package 600 of the sixth embodiment are the same. Specifically, the methods of manufacturing the optoelectronic packages 600, 700 are almost the same. However, in the seventh embodiment, when the transparent material 16 fills in the opening 690h, the liquid transparent material 16 not only tops up the opening 690h but also overflows to the periphery of the opening 690h. In other words, the transparent material 16 covers the top face 692 of the dam 690.

Accordingly, when the transparent substrate 450 is pressed onto the dam 690, the face 452 of the transparent substrate 450 only touches the transparent material. Therefore, after the transparent material 16 is cured, the transparent material 16 is converted into the transparent protection layer 600 and the first connection layer 780t. The first connection layer 780t connects the transparent substrate 450 and the dam 690. Consequently, the optoelectronic package 700 is complete.

Figure 8A:
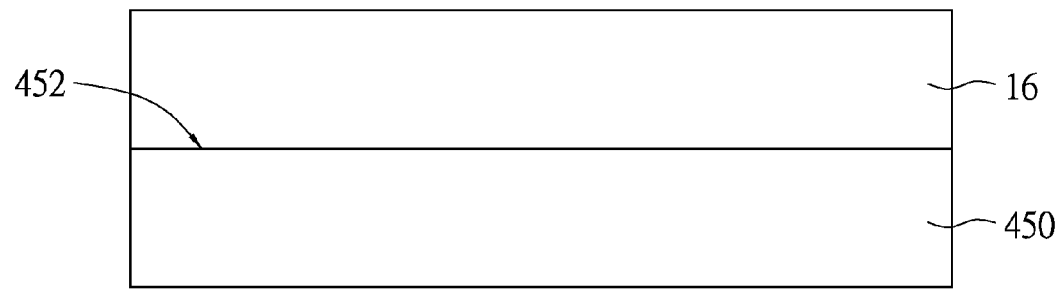
FIGS. 8A to 8B are cross-sectional views showing a method of manufacturing optoelectronic package in accordance with an eighth embodiment of the instant disclosure.
Figure 8B:
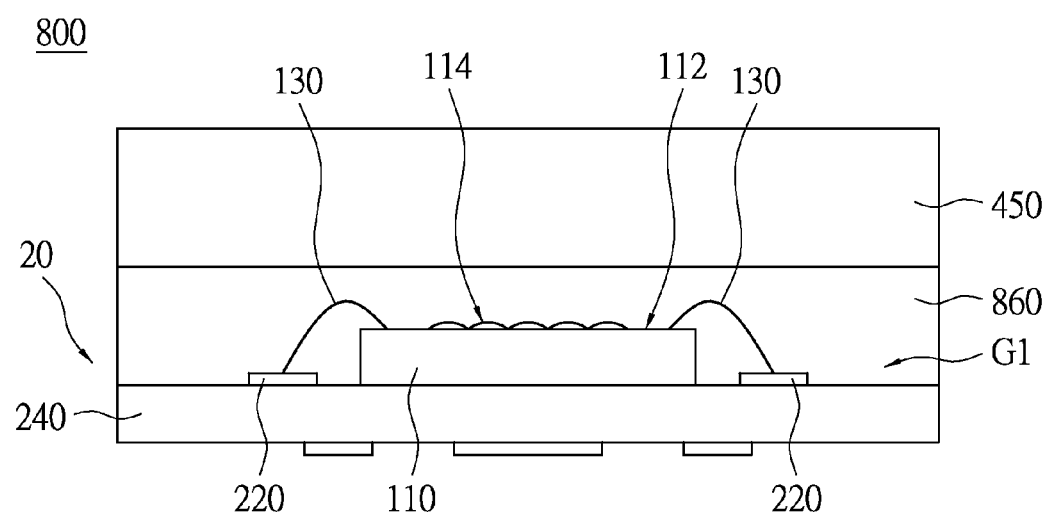

FIGS. 8A and 8B are cross-sectional views showing the method of manufacturing optoelectronic package in accordance with an eighth embodiment of the instant disclosure. Please refer to FIGS. 8A and 8B. The functions of the optoelectronic package 800 of the eighth embodiment and the optoelectronic package 400 (please refer to FIG. 4C) of the forth embodiment are the same. The methods of manufacturing the optoelectronic packages 400, 800 are almost the same. The difference between the optoelectronic packages 400, 800 are described hereinafter, and the identical features are not repeated.

The optoelectronic package 800 includes the optoelectronic chip 110, pads 220, substrate 240, bonding wires 130 and transparent substrate 450. Unlike the optoelectronic package 400 shown in FIG. 4C, the optoelectronic package 800 does not have the dam 490, while the optoelectronic package 800 further includes a transparent protection layer 860.

The transparent protection layer 860 has the same material and is made of the same method as the transparent protection layer 460. However, in the eighth embodiment, the transparent protection layer 860 covers and touches the upper surface 112 of the optoelectronic chip 110 and the active area, and furthermore, the transparent protection layer 860 covers the side of the optoelectronic chip 110. Therefore, except the bottom of the optoelectronic chip 110, the transparent protection layer 860 envelops the optoelectronic chip 110 and all the bonding wires 130 entirely. The transparent protection layer 860 and the substrate 240 seal the optoelectronic chip 110 and block out any moisture or dust.

The method of manufacturing the optoelectronic package 800 is shown in FIG. 8A. Firstly, the transparent material 16 is formed on the transparent substrate 450. Similar to the fourth embodiment, the transparent material 16 covers the face 452 entirely and may be formed by spluttering or printing. However, comparing FIGS. 4A and 8A, the thickness of the transparent material 16 in FIG. 8A is much heavier than that as shown in FIG. 4A.

Then, the transparent material 16 is prebaked to reduce its running. Like in the fourth embodiment, after the transparent material 16 is prebaked, it becomes less running or even immobile like a soft film. Please refer to FIG. 4B for the transparent material 16' as described in the fourth embodiment.

Subsequently, the transparent material 16 is pressed onto the chip assembly 20 to cover the active area 114 of the optoelectronic chip 110. Because the transparent material 16 exhibits well flexibility, when pressing the transparent material 16, the optoelectronic chip 110 and the bonding wires 130 are buried therein, as shown in FIG. 8B. The transparent protection layer 860 completely covers the entire optoelectronic chip 110 and all the bonding wires 130. Alternatively, the transparent material 16 may be formed by attachment. Namely, the transparent material 16 is attached to the face 452 as a dry film.

After pressing the transparent material 16 on the chip assembly 20, it is cured and coverts to transparent protection layer 860. The transparent material 16 may be cured by heating or exposure to light (e.g., ultraviolet light), such that the bonding wires 130 and optoelectronic chip 110 are secured within the transparent protection layer 860. So far, the optoelectronic package 800 is complete.

Figure 9A:
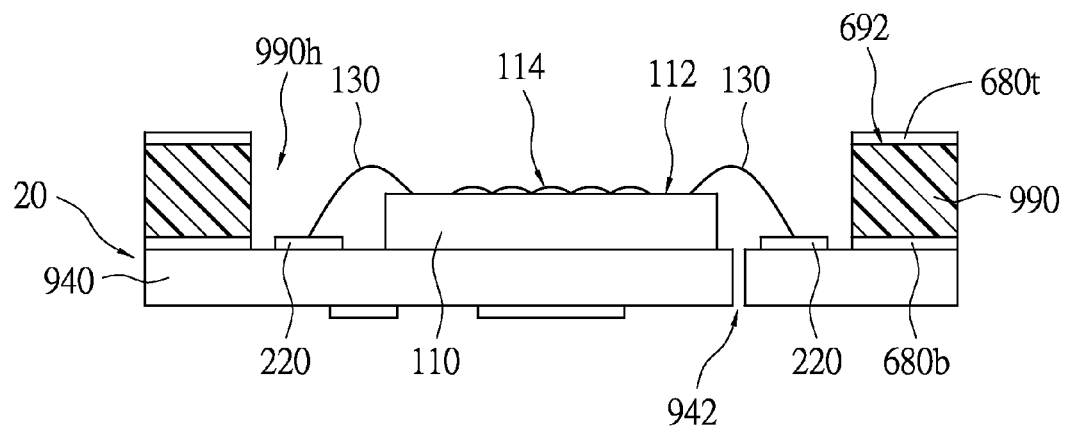
FIGS. 9A to 9B are cross-sectional views showing a method of manufacturing optoelectronic package in accordance with a ninth embodiment of the instant disclosure.
Figure 9B:
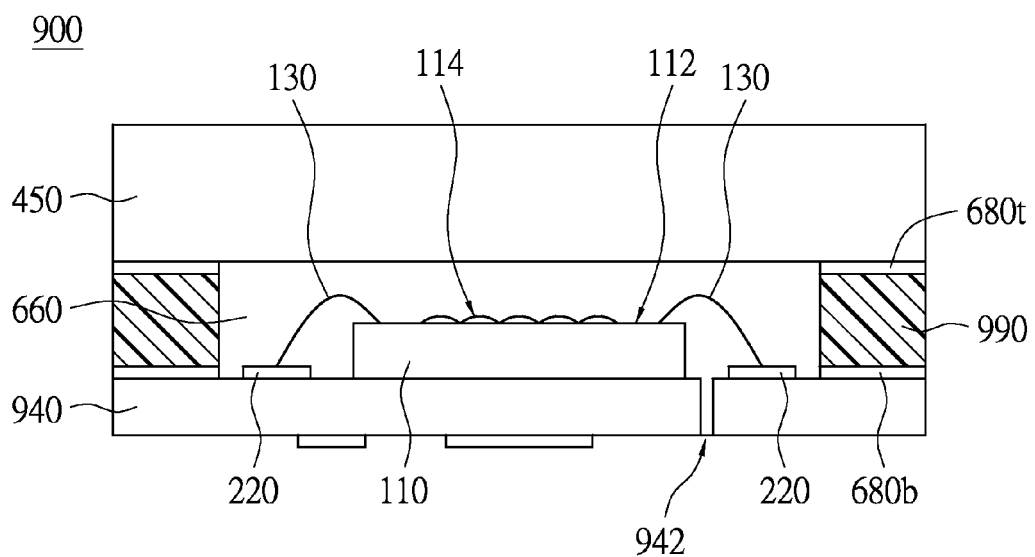

FIGS. 9A and 9B are cross-sectional views showing the method of manufacturing optoelectronic package in accordance with a ninth embodiment of the instant disclosure.

Please refer to FIGS. 9A and 9B. The optoelectronic package 900 of the ninth embodiment is similar to the optoelectronic package 600 of the sixth embodiment. The difference between the two comes from the substrate 940 of the optoelectronic package 900. In the ninth embodiment, the substrate 940 has a thru hole 942 allowing access of the liquid transparent material 16. Also, the methods of making the optoelectronic packages 600, 900 are slightly different.

Please refer to FIG. 9B, which shows a complete optoelectronic package 900. Like the sixth embodiment, the optoelectronic package 900 includes the optoelectronic chip 110, pads 220, bonding wires 130, transparent substrate 450, first connection layer 680t, second connection layer 680b, dam 990 and transparent protection layer 660. However, unlike the sixth embodiment, the optoelectronic package 900 further includes the substrate 940 having a thru hole 942. The thru hole 942 is formed by machine drilling or laser drilling.

It should be noted that the number of the thru hole 942 may be one or more. In FIG. 9A or 9B, there is only one thru hole 942, but the instant disclosure is not limited thereto. Also, the dam 990 may be the dam 590 or 690 in the previous embodiments.

Please refer to FIG. 9A. In the method of manufacturing the optoelectronic package 900, firstly, the dam 990 is disposed on the substrate 940. The dam 990 is attached to the substrate 240 by the second connection layer 680b. The dam 990 has the opening 990h, while the optoelectronic chip 110 is disposed within the opening 990h. After the deposition of the dam 990 on the substrate 940, the first connection layer 680t is formed on the dam 990. In the instant embodiment, the thru hole 942 is formed before the dam 990 is disposed. However, in another embodiment, the thru hole 942 may be formed after the dam 990 is disposed.

Please refer to FIG. 9B. Next, the transparent substrate 450 is pressed onto the dam 990 and covers the optoelectronic chip 110. The transparent substrate 450 is attached to the dam 990 by the first connection layer 680t. Then, the transparent material 16 (not shown in FIG. 9A or 9B) is injected via the thru hole 942. The transparent material 16 covers the optoelectronic chip 110 and the bonding wires 130 and tops up the thru hole 942. Subsequently, the transparent material 16 is cured to from the transparent protection layer 660 that tops up the thru hole 942. So far, the optoelectronic package 900 is complete.

Figure 10A:
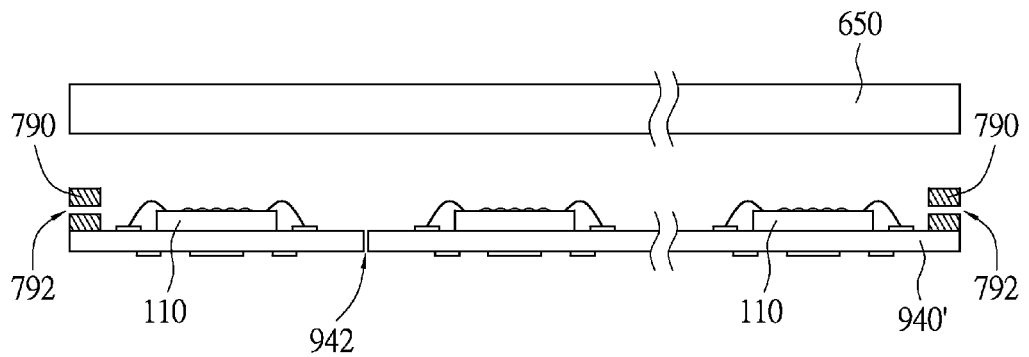
FIGS. 10A to 10C are cross-sectional views showing a method of manufacturing optoelectronic package in accordance with a tenth embodiment of the instant disclosure.
Figure 10B:
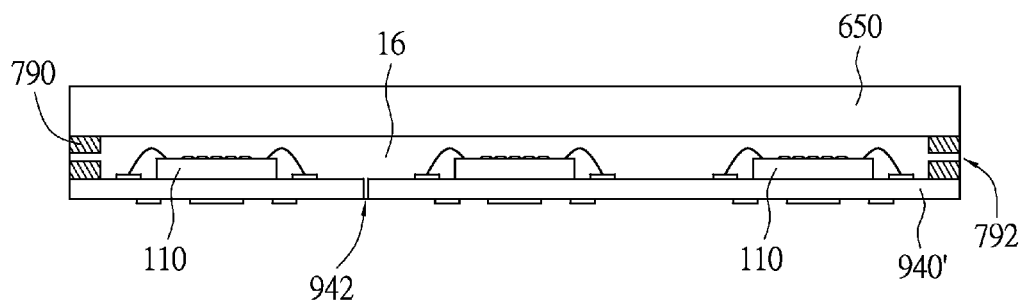
Figure 10C:
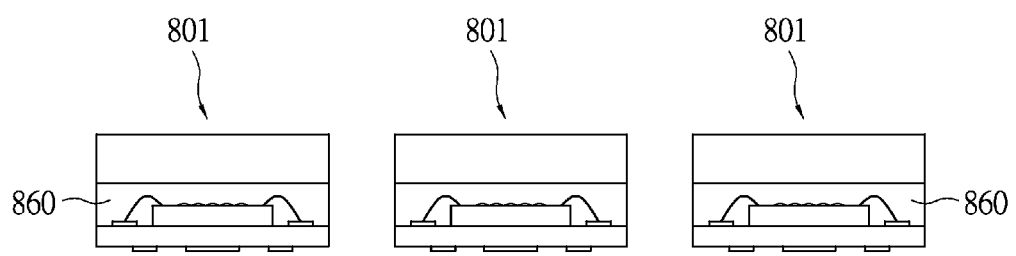

FIGS. 10A to 10C show cross-sectional views of the method of manufacturing optoelectronic package in accordance with a tenth embodiment of the instant disclosure. The structure of the optoelectronic package 801 of the tenth embodiment is the same as the optoelectronic package 800 (please refer to FIG. 8B) of the eighth embodiment. The same features are not repeated hereinafter. The difference between the tenth and the eighth embodiment lies in the methods of manufacturing the optoelectronic packages 801, 800.

Please refer to FIG. 10A. Firstly, the transparent substrate 650 is provided. The plurality of optoelectronic chips 110 and a spacer 790 are disposed on the substrate 940'. The spacer 790 surrounds the optoelectronic chip 110, and the spacer 790 can be shaped as a ring, for example, circle ring or square frame. The substrate 940' is a circuit joint board, for example, wiring panel or strip and can be divided into a plurality of circuit boards. The substrate 940' has at least one thru hole 942. In the tenth embodiment, the substrate 940' has only one thru hole 942, while in another embodiment, the substrate 940' may have more than one thru holes 942. In addition, the shape of the substrate 940' may be round or square and identical to the dimension of the silicon wafer, and the instant embodiment is not limited thereto.

The transparent substrate 650 is similar in material and shape as the transparent substrate 450. The difference between them arises from the dimension. The transparent substrate 650 is larger than the transparent substrate 450. In the following process, the transparent substrate 650 is diced into the plurality of transparent substrate 450. Additionally, the area and shape of the transparent substrate 650 is the same as that of the substrate 940'. The material and method of making of the spacer 790 are the same as the dam 990. However, the dimension of the spacer 790 is different from that of the dam 990, and the spacer 790 surrounds the optoelectronic chips 110. Furthermore, the spacer 790 may have a plurality of holes 792, as shown in FIG. 10A. However, in another embodiment, the spacer 790 may have only one hole 792.

Please refer to FIG. 10B. Next, the transparent substrate 650 is pressed onto the spacer 790 and seals the optoelectronic chip 110. The, the transparent material 16 is injected via the thru hole 942 and covers the optoelectronic chip 110. Because the spacer 790 has the holes 792, when filling the transparent material 16, air between the substrate 940' and the transparent substrate 650 can exit from the holes 792 to allow the entry of the transparent material 16.

Subsequently, the transparent material 16 is cured to form the transparent protection layer (not shown in FIG. 1B). The transparent material is cured by heating or exposure to light (e.g., ultraviolet light). Please refer to FIG. 10C. After the transparent material 16 is cured, the transparent substrate 650 and the substrate 940' are diced to form the plurality of optoelectronic packages 801 having the transparent protection layer 860.

Figure 11A:
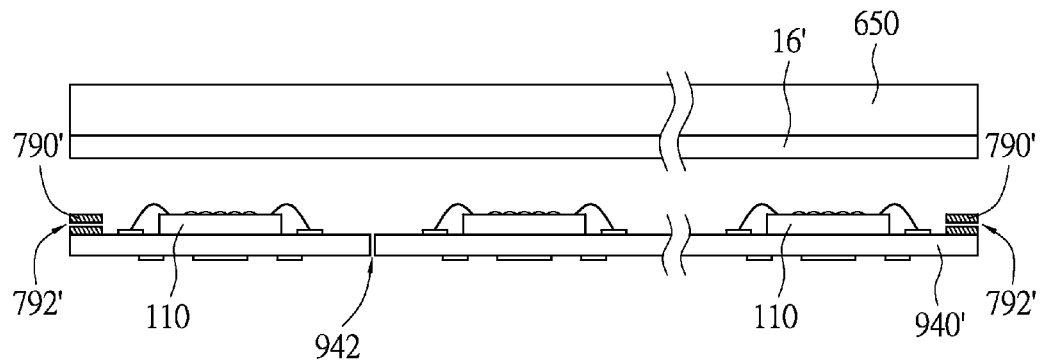
FIGS. 11A to 11C are cross-sectional views showing a method of manufacturing optoelectronic package in accordance with an eleventh embodiment of the instant disclosure.
Figure 11B:
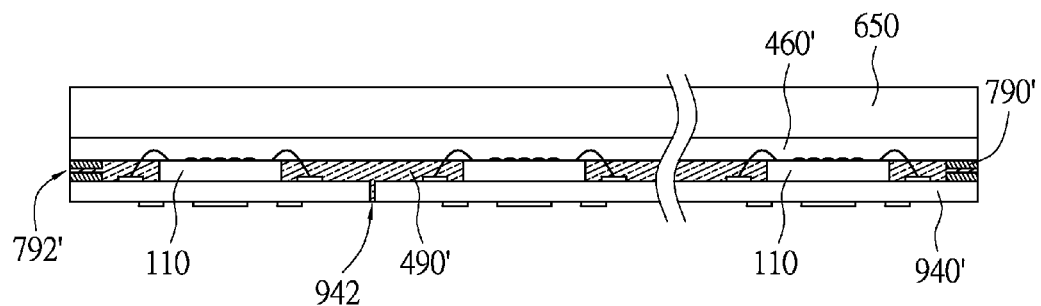
Figure 11C:
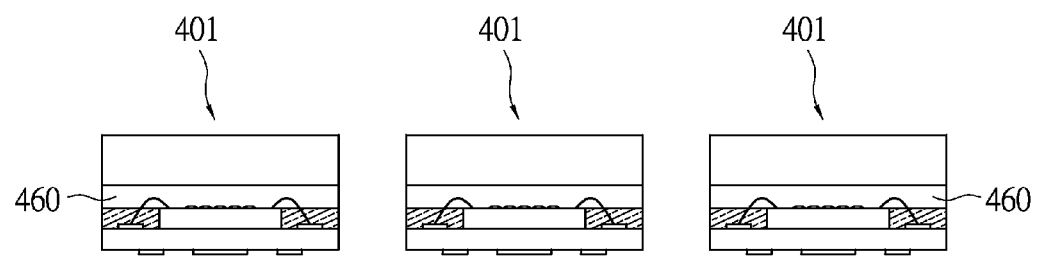

FIGS. 11A to 11C are cross-sectional views showing the method of manufacturing optoelectronic package in accordance with an eleventh embodiment of the instant disclosure. The optoelectronic package 401 of the eleventh embodiment is the same as the optoelectronic package 400 of the fourth embodiment (please refer to FIG. 4C) in structure. The similar features are not repeated hereinafter. In addition, the method of making the optoelectronic package 401 of the eleventh embodiment is similar to the tenth embodiment. Only the difference is described hereinafter.

Please refer to FIG. 11A. Firstly, the transparent material 16' is formed on the transparent substrate 450, and the plurality of optoelectronic chips 110 and the spacer 790' are disposed on the substrate 940'. The transparent material 16' covers the entire face 452. The process of the transparent material 16' formation has been described previously, and here it is not repeated to avoid repetition. The spacer 790' surrounds the optoelectronic chip 110 and has at least one hole 792'. The spacer 790' has a shorter height than the spacer 790 of the tenth embodiment, and the hole 792' is smaller than the hole 792.

Please refer to FIG. 11B. Next, the transparent substrate 650 is pressed onto the spacer 790' and seals the optoelectronic chip 110. Meanwhile, the transparent material 16' touches the spacers 790'. Then, the transparent material 16' is heated or exposed to light (e.g., ultraviolet light), such that the transparent material 16' is cured to form the transparent protection layer 460'. A cavity is formed between the transparent protection layer 460' and the substrate 940', and air remains in the cavity.

Subsequently, the molding compound is injected via the thru hole 942', the molding compound and the transparent protection layer 460' covers the optoelectronic chip 110. Following that, the molding compound is cured to form the dam 490'. Because the spacer 790' has holes 792', when filling the molding compound, air between the transparent protection layer 460' and the substrate 940' can exit from the holes 792' to allow the entry of the molding compound. Please refer to FIG. 11C. After the dam 490' is formed, the transparent substrate 650 and the substrate 940' are diced to form the plurality of optoelectronic packages 401 having transparent protection layer 460.

Figure 12A:
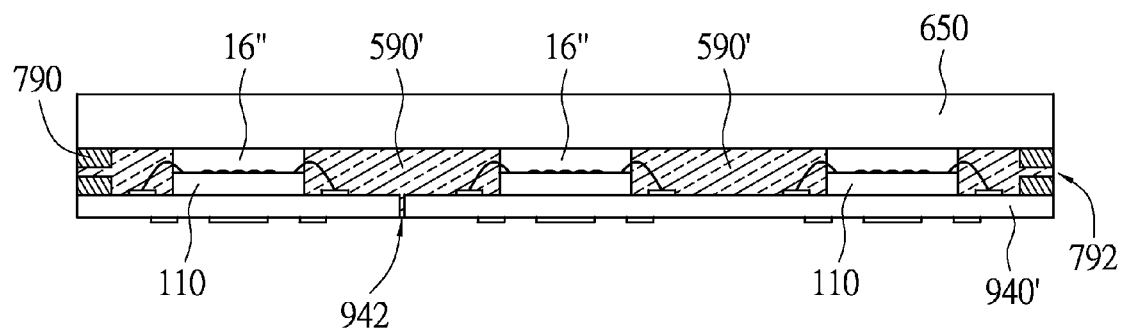
FIGS. 12A to 12B are cross-sectional views showing a method of manufacturing optoelectronic package in accordance with a twelfth embodiment of the instant disclosure.
Figure 12B:
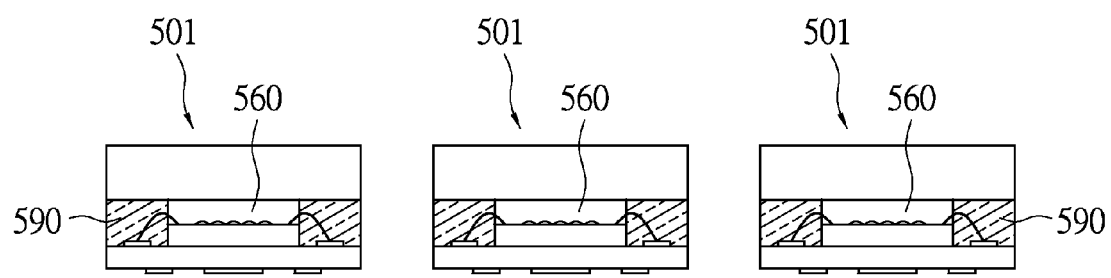

FIGS. 12A and 12B are cross-sectional views showing the method of manufacturing optoelectronic package in accordance with a twelfth embodiment of the instant disclosure. The structure of the optoelectronic package 501 of the twelfth embodiment is similar to that of the optoelectronic package 500 of the fifth embodiment (please refer to FIG. 5B). The same features are not repeated, and only the difference is described hereinafter.

Please refer to FIG. 12A. Firstly, the transparent material 16" is formed on the transparent substrate 650, and the plurality of optoelectronic chips 110 and the spacer 790 are disposed on the substrate 940'. The transparent material 16" partially covers the transparent substrate 650. The process of forming the transparent material 16" has been described in the fifth embodiment and is not repeated hereinafter. The spacer 790 surrounds the optoelectronic chips 110 and has one or more holes 792.

Next, the transparent substrate 650 is pressed onto the spacer 790 and seals the optoelectronic chips 110. The transparent material 16" touches the optoelectronic chips 110 yet not the spacer 790. Then, the transparent material 16" is heated or exposed to light (e.g., ultraviolet light) so as to form the transparent protection layer (i.e., the cured transparent material 16"). Meanwhile, a cavity is formed between the two adjacent optoelectronic chips 110, and air remains in the cavity.

Subsequently, the molding compound is injected via the thru hole 942 and fills the cavity. Following that, the molding compound is cured to form the dam 590'. Because the spacer 790 has holes 792, when filling the molding compound, the air in the cavity exits from the holes 792 to allow the entry of the molding compound. Please refer to FIG. 12B. After the dam 590' is formed, the transparent substrate 650 and the substrate 940' are diced to form the plurality of optoelectronic packages 501 having transparent protection layers 560 and dam 590.

Figure 13A:
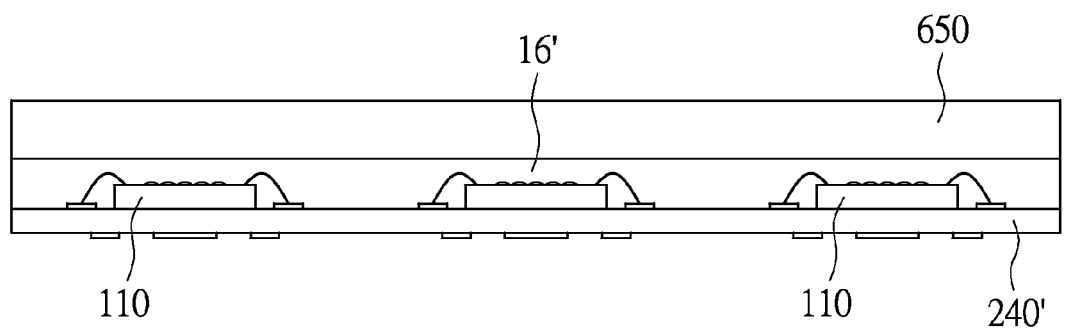
FIGS. 13A to 13B are cross-sectional views showing a method of manufacturing optoelectronic package in accordance with a thirteenth embodiment of the instant disclosure.
Figure 13B:
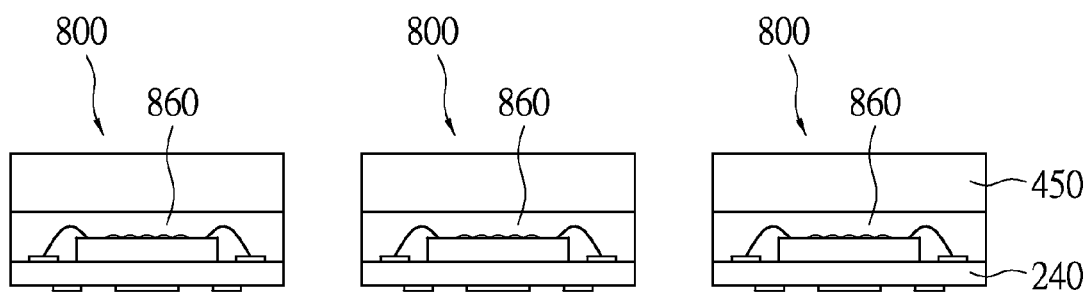

FIGS. 13A and 13B are cross-sectional views showing the method of manufacturing optoelectronic package in accordance with a thirteenth embodiment of the instant disclosure. The optoelectronic package 800 of the thirteenth embodiment is similar to the optoelectronic package 800 of the eighth embodiment (please refer to FIG. 8B) in structure. The structure and function of the optoelectronic package 800 are not repeated. Only the difference between the thirteenth and the eighth embodiments is described hereinafter.

Please refer to FIG. 13A. Firstly, the transparent material 16' is formed on the transparent substrate 650, and the plurality of optoelectronic chips 110 is disposed on the substrate 240'. The substrate 240' is a wiring panel and has the optoelectronic chips 110 yet not the spacer 790 or 790'. The transparent material 16' completely covers the transparent substrate 650. The thickness of the transparent material 16' is thicker than that of the transparent material 16 as shown in FIG. 4A. The method of forming the transparent material 16' has been described in the fourth embodiment and not repeated hereinafter.

Next, the transparent substrate 650 is pressed onto the substrate 240' and touches the optoelectronic chips 110. Because the transparent 16' is thicker, the transparent material 16' completely covers the optoelectronic chips 110 and the bonding wires 130. Then, the transparent material 16' is heated or exposed to light (e.g., ultraviolet light), such that the transparent material 16' is cured to form the transparent protection layer (i.e., the cured transparent material 16'). Following that, the transparent substrate 650 and the substrate 240' are diced to form the plurality of optoelectronic packages 800 having transparent protection layer 860 and transparent substrate 450.

It is worth noting that the optoelectronic packages of the fourth to the thirteenth embodiments have the substrate 240 (i.e., the circuit substrate) and the transparent substrate 450. However, a person skilled in the art should appreciate that the substrate 240 can be replaced by the substrate 140 which does not have any circuit, and the release layer 170 and the light filter layer 180 can be used in the fourth to the thirteenth embodiments.

In other words, the substrate 140 and the release layer 170 of the first embodiment can be used in the optoelectronic packages 400, 401, 500, 501, 600, 700, 800, 801 and 900 to replace the substrate 240 and/or the transparent substrate 450. Alternatively, the optoelectronic packages 400, 401, 500, 501, 600, 700, 800, 801 and 900 may have the light filter layer 180. Therefore the substrate 140, release layer 170 and light filter layer 180 can be used in the fourth to the thirteenth embodiments. The optoelectronic packages 400, 401, 500, 501, 600, 700, 800, 801 and 900 do not intend to limit the scope of the instant disclosure.

Furthermore, the optoelectronic packages 400, 401, 500, 501, 600, 700, 800, 801 and 900 may be produced by water level package (WLP). However, it should be noted that other packaging techniques can also be adapted, for example, chip size package (CSP).

In conclusion, the optoelectronic package of the instant disclosure does not form the gap or cavity where air remains because the transparent protection layer covers the optoelectronic chip. In this regard, the transparent protection layer seals and protection optoelectronic chip, such that moisture or dust is blocked.

Moreover, the optoelectronic package does not have holes. Even though the optoelectronic package does not have holes, when heated, the optoelectronic package does not swell and burst because there is no air therein. The yield rate is therefore highly promoted, and the step of forming the holes is not required. That is to say, the production cost is reduced.

Figure 14:
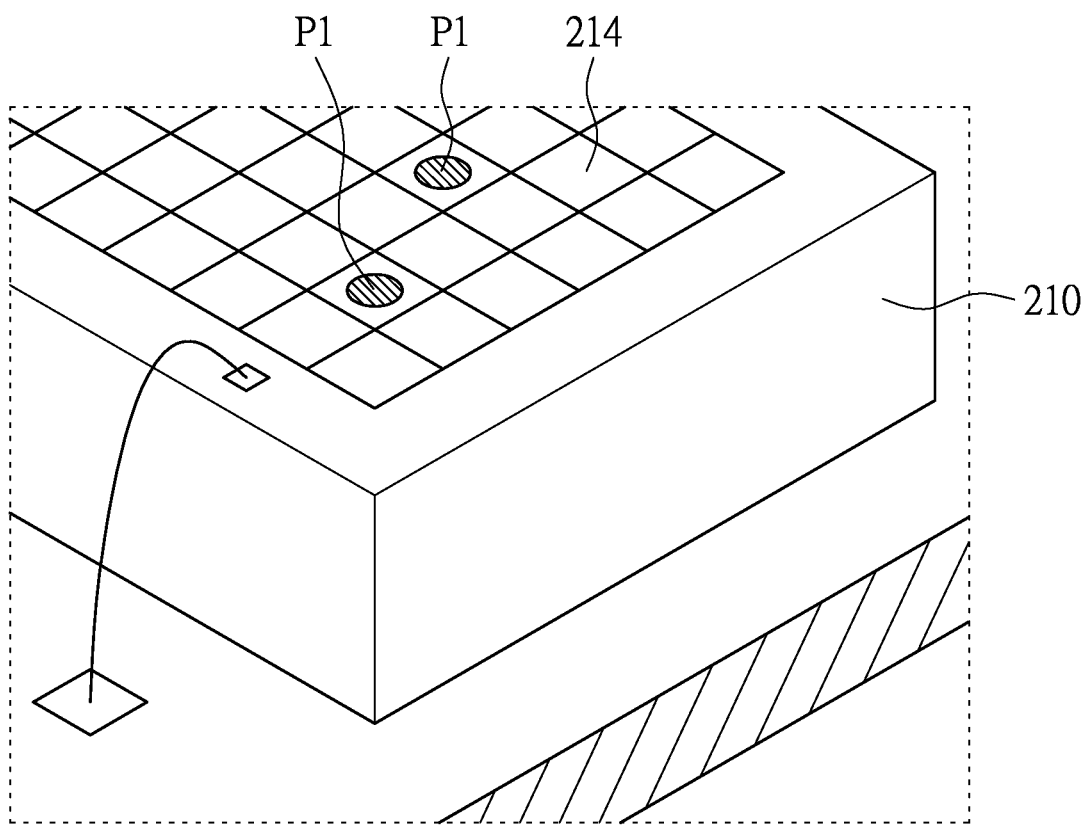
FIG. 14 is a partially enlarged view at an optoelectronic chip of an optoelectronic package in accordance with an embodiment of the instant disclosure.

Please refer to FIG. 14. It is worth mentioning the optoelectronic chip 210 may be one of the optoelectronic chips 110 in the first to the thirteenth embodiments. The optoelectronic chip 210 is a photo-sensing component. In the process of manufacturing the optoelectronic packages, particles P1 may be attached to the active area 214 of the optoelectronic chip 210. The particles P1 may be dust or powder produced in the manufacturing process. When the particles P1 are attached to the active area 214, the image quality captured by the optoelectronic chip 210 is affected.

Thus, after the transparent protection layer (for example, the transparent protection layer 160, 260, 460, 460', 560, 660 or 860 which is not shown in FIG. 14) is formed and covers the active area 214, the particles P1 on the active area 214 are covered and fixed. The logic circuitry of the optoelectronic chip 110 can be sued to detect the position of the particles P1. Following that, according to the position of the particles P1, the image calibration can be performed by algorithm. Namely, the pixels close to the particles P1 in the active area 214 undergoes color adjustment or compensation to attenuate the negative effect resulting from the particles P1. The algorithm may be, for example, matrix algebra methodology.

In the conventional image sensor, the active area of the chip is positioned in the cavity with air. The particles (for example, dust or the powder produced in the manufacturing process) may fall on the active area and therefore affect the image capture function of the image sensor. Because the particles falls on the active area in the cavity with air and are not fixed, when the image sensor moves or vibrates, the particles move as well. In other words, the position of the particles is variable.

Thus, when the conventional image sensor is under operation and undergoes hand shaking, the image sensor screens the active area constantly to track the position of the particles and repeats image calibration so as to maintain the image quality.

Compared to the conventional image sensor, the transparent protection layer of the instant disclosure covers the particles P1, such that the particles P1 do not move on the active area 214 when the optoelectronic package moves, vibrates or shakes. The transparent protection layer fixes the particles P1, and therefore the optoelectronic chip 210 screens the active area 213 once along to ensure the position of the particles P1. In other words, the optoelectronic chip 210 does not screen the active area 214 constantly for allocating the particles P1. Hence, the transparent protection layer minimizes the negative effect caused by the particles P1 in image capturing and reduces the workload and operation time of the optoelectronic chip 210. Overall, the image quality is improved.

The descriptions illustrated supra set forth simply the embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. An optoelectronic package comprising:
an optoelectronic chip having a first surface and an active area defined on the first surface;
a transparent protection layer disposed on the optoelectronic chip and covering at least the active area defined on the first surface, wherein the transparent protection layer is in contact with and attached to the active area whereby the transparent protection layer covers and fixes positions of one or more particles on the active area; and
a plurality of pads electrically coupled to the optoelectronic chip.

2. The optoelectronic package according to claim 1, wherein the transparent protection layer contains amide resin.

3. The optoelectronic package according to claim 1 further comprising a plurality of bonding wires, wherein the bonding wires connect the optoelectronic chip and the pads, the transparent protection layer touches the bonding wires and covers at least a portion of each of the bonding wires.

4. The optoelectronic package according to claim 1 further comprising a dam, wherein the dam surrounds the optoelectronic chip and touches the transparent protection layer, the dam surrounds the transparent protection layer, and the thickness of the dam is greater than that of the optoelectronic chip.

5. The optoelectronic package according to claim 4 further comprising a transparent substrate and a circuit board, wherein the transparent substrate is disposed on the transparent protection layer and connects to the transparent protection layer, the circuit board has an assembly surface, and the pads, the dam and the optoelectronic chip are disposed on the assembly surface, wherein the optoelectronic chip, the dam and the transparent protection layer are sandwiched between the transparent substrate and the circuit board.

6. The optoelectronic package according to claim 4, wherein the dam touches the optoelectronic chip.

7. The optoelectronic package according to claim 6 further comprising a transparent substrate and a circuit board, wherein the transparent substrate is disposed on the transparent protection layer and connects to the transparent protection layer, the circuit board has an assembly surface, and the pads, the dam and the optoelectronic chip are disposed on the assembly surface, wherein the optoelectronic chip, the dam and the transparent protection layer are sandwiched between the transparent substrate and the circuit board.

8. The optoelectronic package according to claim 5, wherein the circuit board is formed with at least one thru hole, and the transparent protection layer fills in the thru hole.

9. The optoelectronic package according to claim 1 further comprising a transparent substrate, wherein the transparent substrate has a recess, the optoelectronic chip and the pads are disposed in the recess, the transparent protection layer fills in the recess and covers the optoelectronic chip and the pads.

10. The optoelectronic package according to claim 9 further comprising a circuit board and an attachment layer, wherein the circuit board has an assembly surface, the pads and the optoelectronic chip are disposed on the assembly surface, wherein the transparent protection layer touches and connects to the assembly surface, the attachment layer is disposed outside the recess and connects the circuit board and the transparent substrate.

11. A method of manufacturing an optoelectronic package, comprising:
providing a chip assembly, wherein the chip assembly includes an optoelectronic chip, a plurality of pads electrically coupled to the optoelectronic chip and a substrate, the optoelectronic chip and the pads disposed on the substrate, and the optoelectronic chip having a first surface and an active area defined on the first surface;
forming a transparent material on the chip assembly on the first surface, wherein the transparent material covers at least the active area; and
curing the transparent material to convert the transparent material into a transparent protection layer that covers and is in contact with and attached to at least the active area, and that covers and fixes positions of one or more particles on the active area.

12. A method of manufacturing an optoelectronic package, comprising:
providing a chip assembly, wherein the chip assembly includes an optoelectronic chip, a plurality of pads electrically coupled to the optoelectronic chip and a substrate, the optoelectronic chip and the pads disposed on the substrate, and the optoelectronic chip having a first surface and an active area defined on the first surface;
forming a transparent material on the chip assembly on the first surface, wherein the transparent material covers at least the active area;
curing the transparent material to convert the transparent material into a transparent protection layer; and
removing the substrate after the curing of the transparent material.

13. The method of manufacturing optoelectronic package according to claim 11 further comprising:
forming the transparent material on a transparent substrate before covering the transparent material on the substrate; and
covering the transparent material on the chip assembly by pressing the transparent material on the chip assembly.

14. The method of manufacturing optoelectronic package according to claim 13 further comprising:

removing the transparent substrate after curing the transparent material.

15. The method of manufacturing optoelectronic package according to claim 13, wherein forming the transparent material on the transparent substrate comprises:
   attaching the transparent material to the transparent substrate.

16. The method of manufacturing optoelectronic package according to claim 13, wherein forming the transparent material on the transparent substrate comprises:
   spreading a spreading layer on the transparent substrate; and
   prebaking the spreading layer.

17. The method of manufacturing optoelectronic package according to claim 13, wherein after the transparent material is pressed onto the chip assembly, a gap is formed between the transparent substrate and the substrate, and a molding compound fills in the gap.

18. The method of manufacturing optoelectronic package according to claim 11 further comprising:
   disposing a frame on the substrate before covering the transparent material on the chip assembly, wherein the frame has a top face, a bottom face and an opening exposing to the top face, and the optoelectronic chip is disposed in the opening; and
   filling in the transparent material in the opening when covering the transparent material on the chip assembly.

19. The method of manufacturing optoelectronic package according to claim 18 further comprising:
   pressing a transparent substrate onto the frame after filling in the transparent material m the opening, wherein the transparent substrate covers the optoelectronic chip.

20. The method of manufacturing optoelectronic package according to claim 11, wherein the substrate is a circuit substrate and electrically connected to the pads and optoelectronic chip.

21. The method of manufacturing optoelectronic package according to claim 11, further selecting the optoelectronic chip to include logic for:
   detecting the positions of the particles on the active area; and
   adjusting an image deriving function of the optoelectronic chip according to the positions of the particles,
   wherein the detecting and the adjusting are not constantly performed.

22. The optoelectronic package of claim 1, wherein the optoelectronic chip further comprises logic for detecting the positions of the particles on the active area and adjusting an image deriving function of the optoelectronic chip according to the positions of the particles, wherein the logic is configured not constantly performing the detecting and the adjusting.

* * * * *